(12) United States Patent
Tripodi et al.

(10) Patent No.: US 12,112,260 B2
(45) Date of Patent: Oct. 8, 2024

(54) METROLOGY APPARATUS AND METHOD FOR DETERMINING A CHARACTERISTIC OF ONE OR MORE STRUCTURES ON A SUBSTRATE

(71) Applicant: ASML Netherlands B.V., Veldhoven (NL)

(72) Inventors: Lorenzo Tripodi, Eindhoven (NL); Patrick Warnaar, Tilburg (NL); Grzegorz Grzela, Eindhoven (NL); Mohammadreza Hajiahmadi, Rotterdam (NL); Farzad Farhadzadeh, Eindhoven (NL); Patricius Aloysius Jacobus Tinnemans, Hapert (NL); Scott Anderson Middlebrooks, Duizel (NL); Adrianus Cornelis Matheus Koopman, Hilversum (NL); Frank Staals, Eindhoven (NL); Brennan Peterson, Longmont, CO (US); Anton Bernhard Van Oosten, Lommel (BE)

(73) Assignee: ASML Netherlands B.V., Veldhoven (NL)

( * ) Notice: Subject to any disclaimer, the term of this patent is extended or adjusted under 35 U.S.C. 154(b) by 1105 days.

(21) Appl. No.: 16/424,811

(22) Filed: May 29, 2019

(65) Prior Publication Data
US 2019/0378012 A1 Dec. 12, 2019

(30) Foreign Application Priority Data

Jun. 8, 2018 (EP) .................................. 18176718
Aug. 23, 2018 (EP) .................................. 18190559
Nov. 14, 2018 (EP) .................................. 18206279

(51) Int. Cl.
*G06N 3/08* (2023.01)
*G01B 11/02* (2006.01)
(Continued)

(52) U.S. Cl.
CPC ............... *G06N 3/08* (2013.01); *G01B 11/02* (2013.01); *G01N 21/55* (2013.01); *G06T 7/0006* (2013.01);
(Continued)

(58) Field of Classification Search
USPC .......................................................... 706/25
See application file for complete search history.

(56) References Cited

U.S. PATENT DOCUMENTS 5,611,020 A 3/1997 Bigus
6,952,253 B2 10/2005 Lof et al.
(Continued)

FOREIGN PATENT DOCUMENTS

EP 1628164 A2 2/2006
EP 3435162 A1 1/2019
(Continued)

OTHER PUBLICATIONS

International Search Report and Written Opinion in International Application No. PCT/EP2019/062767, dated Dec. 12, 2019, 9 pages.
(Continued)

*Primary Examiner* — Mikhail Itskovich
(74) *Attorney, Agent, or Firm* — Sterne, Kessler, Goldstein & Fox P.L.L.C.

(57) ABSTRACT

Disclosed is a method of determining a characteristic of interest relating to a structure on a substrate formed by a lithographic process, the method comprising: obtaining an input image of the structure; and using a trained neural network to determine the characteristic of interest from said input image. Also disclosed is a reticle comprising a target forming feature comprising more than two sub-features each having different sensitivities to a characteristic of interest when imaged onto a substrate to form a corresponding target (Continued)

structure on said substrate. Related methods and apparatuses are also described.

19 Claims, 8 Drawing Sheets

(51) Int. Cl.
  *G01N 21/55* (2014.01)
  *G06T 7/00* (2017.01)
(52) U.S. Cl.
  CPC .......... *G06T 7/001* (2013.01); *G01B 2210/56* (2013.01); *G06T 2207/20081* (2013.01); *G06T 2207/20084* (2013.01); *G06T 2207/30148* (2013.01)

(56) References Cited

U.S. PATENT DOCUMENTS

| | | | |
|---|---|---|---|
| 9,594,299 | B2 | 3/2017 | Hinnen et al. |
| 2008/0204832 | A1 | 8/2008 | Haikin |
| 2009/0063378 | A1 | 3/2009 | Izikson |
| 2010/0328655 | A1 | 12/2010 | Den Boef |
| 2011/0026032 | A1 | 2/2011 | Den Boef et al. |
| 2011/0102753 | A1 | 5/2011 | Kerkhof et al. |
| 2011/0249244 | A1 | 10/2011 | Leewis et al. |
| 2012/0044470 | A1 | 2/2012 | Smilde et al. |
| 2016/0117812 | A1 | 4/2016 | Pandev et al. |
| 2016/0161863 | A1 | 6/2016 | Boef et al. |
| 2017/0351952 | A1* | 12/2017 | Zhang ...................... G06N 3/04 |

FOREIGN PATENT DOCUMENTS

| | | |
|---|---|---|
| EP | 3480554 A1 | 5/2019 |
| WO | WO 2011/012624 A1 | 2/2011 |
| WO | WO 2015/018625 A1 | 2/2015 |
| WO | 2017171890 A1 | 10/2017 |
| WO | 2017171891 A1 | 10/2017 |

OTHER PUBLICATIONS

International Preliminary Report on Patentability in International Application No. PCT/EP2019/062767, dated Dec. 17, 2020, 7 pages.

Taiwanese Office Action in Taiwanese Application No. 108119376, dated Jul. 23, 2020, 8 pages.

* cited by examiner

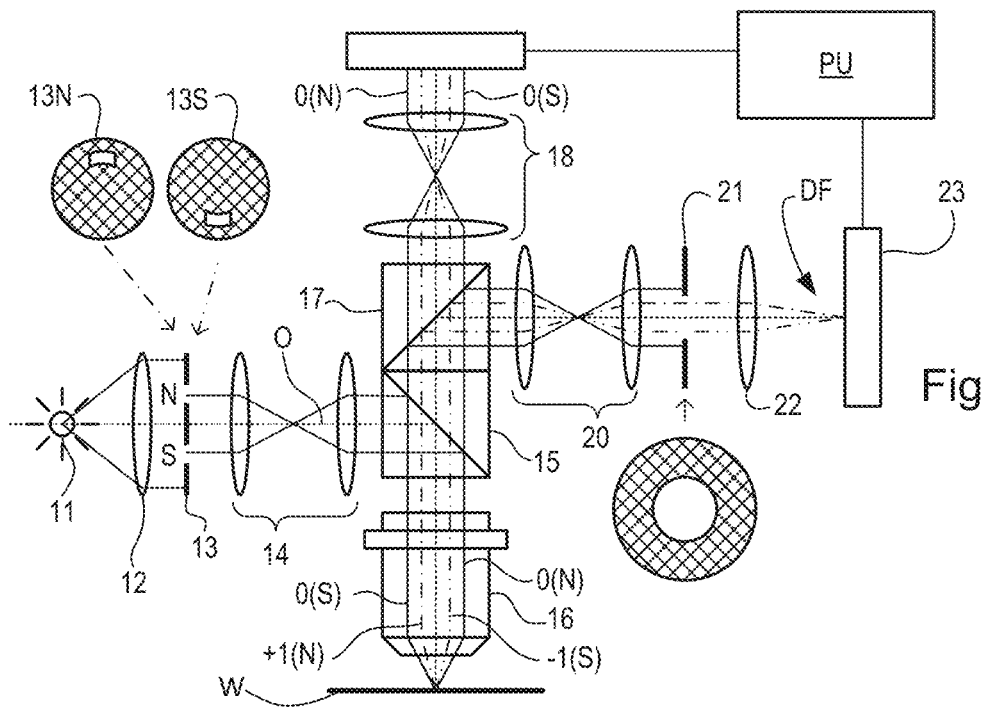
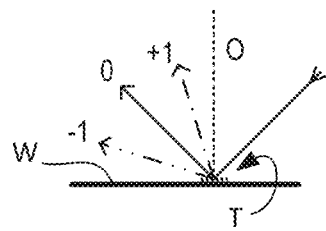
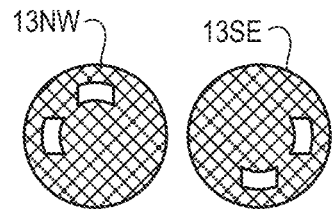
Fig. 5(a)  Fig. 5(b)  Fig. 5(c)  Fig. 5(d)
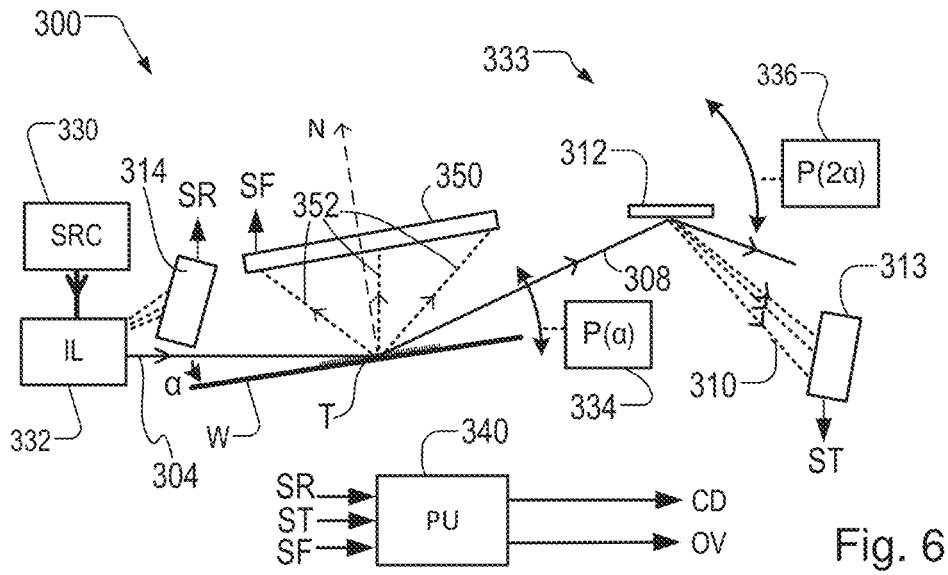
Fig. 6

|  | $p_1$ | $p_2$ | $p_3$ | $p_4$ | CH | $p_1$ | $p_2$ | $p_3$ | $p_4$ |
|---|---|---|---|---|---|---|---|---|---|
| $(CD/p)_1$ | H | V | H | V |  | V | H | V | H |
| $(CD/p)_2$ | V | H | V | H |  | H | V | H | V |
| $(CD/p)_3$ | H | V | H | V |  | V | H | V | H |
| $(CD/p)_4$ | V | H | V | H |  | H | V | H | V |
| $(CD/p)_5$ | V | H | V | H |  | H | V | H | V |
| $(CD/p)_6$ | H | V | H | V |  | V | H | V | H |
| $(CD/p)_7$ | V | H | V | H |  | H | V | H | V |
| $(CD/p)_8$ | H | V | H | V |  | V | H | V | H |
| $(CD/p)_9$ | V | H | V | H |  | H | V | H | V |

METROLOGY APPARATUS AND METHOD FOR DETERMINING A CHARACTERISTIC OF ONE OR MORE STRUCTURES ON A SUBSTRATE

FIELD

The present invention relates to a metrology apparatus or an inspection apparatus for determining a characteristic of structures on a substrate. The present invention also relates to a method for determining a characteristic of structures on a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-k1 lithography may be used to process features with dimensions smaller than the classical resolution limit of a lithographic apparatus. In such process, the resolution formula may be expressed as $CD = k_1 \times \lambda / NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable to make frequently measurements of the structures created, e.g., for process control and verification. Various tools for making such measurements are known, including scanning electron microscopes or various forms of metrology apparatuses, such as scatterometers. A general term to refer to such tools may be metrology apparatuses or inspection apparatuses. In specific embodiments relatively small wavelength ranges of the visible light spectrum is used for the inspection of the structures manufactured on the substrate and there is a need to move to higher and to lower wavelengths and there is a need to use broader wavelength ranges during a single measurement. In specific embodiments, the optical system of the inspection or metrology apparatus has a relative high NA. In specific embodiments of the optical system, stray light and/or ghosting may be a problem. In specific embodiment dark-field imaging is used and the amount of recorded noise may be too high in certain cases. It may be possible to provide solutions for the above discussed requirements and/or to provide a solution for the above discussed problems by improving the quality of the optical elements used in the inspection or metrology apparatus. A problem is that, for example, aberration requirements over a wide wavelength range become very strict. This may result in optical elements that cannot be manufactured or may result in optical elements that become too expensive for the metrology or inspection apparatus.

Therefore it is desirable to reduce the aberration requirements of optical elements in metrology apparatuses while still obtaining acceptable measurement accuracy.

SUMMARY

It is an object to provide an effective an efficient solution for an inspection or metrology apparatus that solves one or more of the above discussed problems or limitations.

Embodiments of the invention are disclosed in the claims and in the detailed description.

In a first aspect of the invention there is provided a method of determining a characteristic of interest relating to a structure on a substrate formed by a lithographic process, the method comprising: obtaining an input image of the structure; and using a trained neural network to determine the characteristic of interest from said input image.

In a second aspect of the invention there is provided a reticle comprising a target forming feature comprising more than two sub-features each having different sensitivities to a characteristic of interest when imaged onto a substrate to form a corresponding target structure on said substrate.

In a third aspect of the invention there is provided a metrology system for determining a characteristic of interest relating to at least one structure on a substrate formed by a lithographic process, the metrology apparatus comprising: a trained neural network; and a processor being configured to: obtain an input image of the structure; and use the trained neural network to determine the characteristic of interest from said input image.

In a fourth aspect of the invention, there is provided a method for training a neural network, comprising: obtaining first training images of a calibration structure for different values of a characteristic of interest and corresponding known values of the characteristic of interest; and using the first training images and corresponding known values of the characteristic of interest to train the neural network to infer values for the characteristic of interest from said first training images.

In a fifth aspect of the invention, there is provided a method of optimizing measurement settings for measuring a characteristic of interest relating to a structure on a substrate formed by a lithographic process, the method comprising: obtaining measurement data relating to measurement of the structure; and using a trained model to determine one or more optimal measurement settings from said measurement data.

In a sixth aspect of the invention, there is provided a method for calibrating a model comprising: obtaining training measurement data of a calibration structure for different values of a characteristic of interest, for different measurement settings and for other structure and/or stack parameter variations, and further obtaining corresponding known values of the characteristic of interest, and using the training measurement data and corresponding known values of the characteristic of interest to train the neural network to infer the efficacy of a measurement of the characteristic of interest based on the measurement settings.

Also disclosed is a non-transitory computer program product comprising machine-readable instructions for causing a processor to cause performance of the method of the first aspect.

BRIEF DESCRIPTION OF THE DRAWINGS

Embodiments of the invention will now be described, by way of example only, with reference to the accompanying schematic drawings, in which:

FIGS. 5(a)-5(d) comprise 5(a) a schematic diagram of a dark field scatterometer for use in measuring targets according to embodiments of the invention using a first pair of illumination apertures, 5(b) a detail of diffraction spectrum of a target grating for a given direction of illumination 5(c) a second pair of illumination apertures providing further illumination modes in using the scatterometer for diffraction based overlay measurements and 5(d) a third pair of illumination apertures combining the first and second pair of apertures;

FIG. 6 schematically depicts an EUV metrology device according to an embodiment of the invention;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
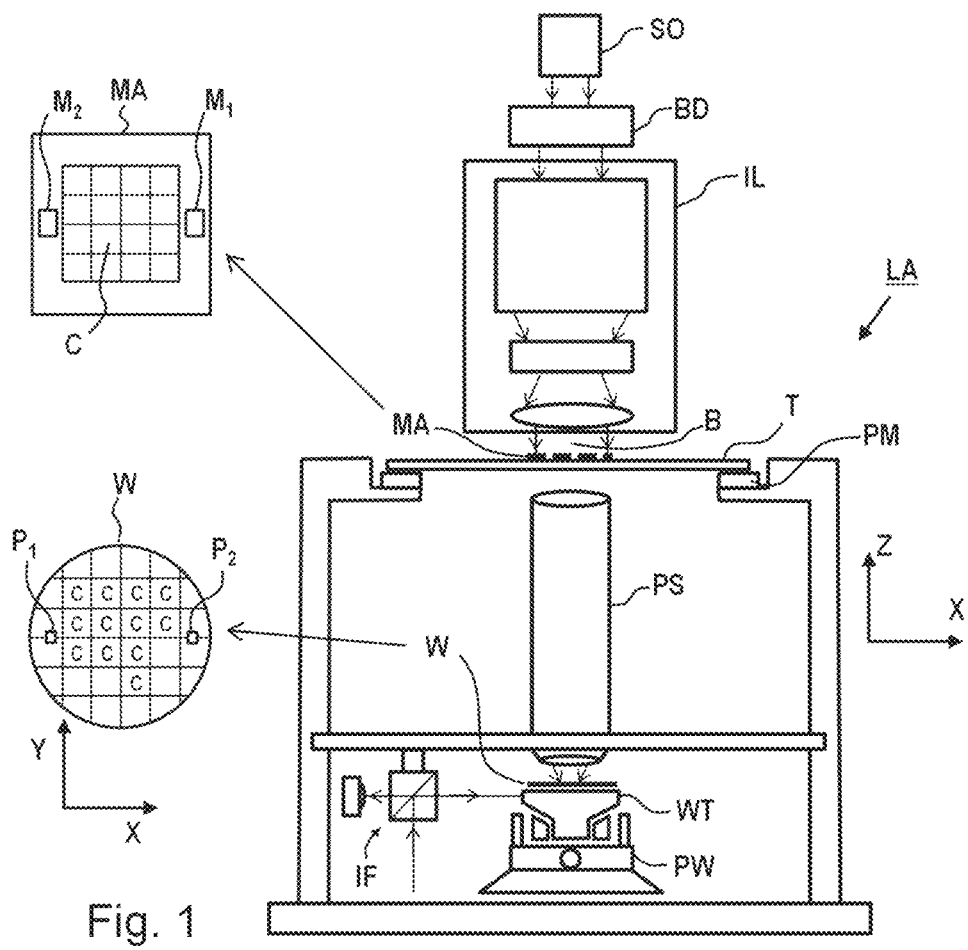
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
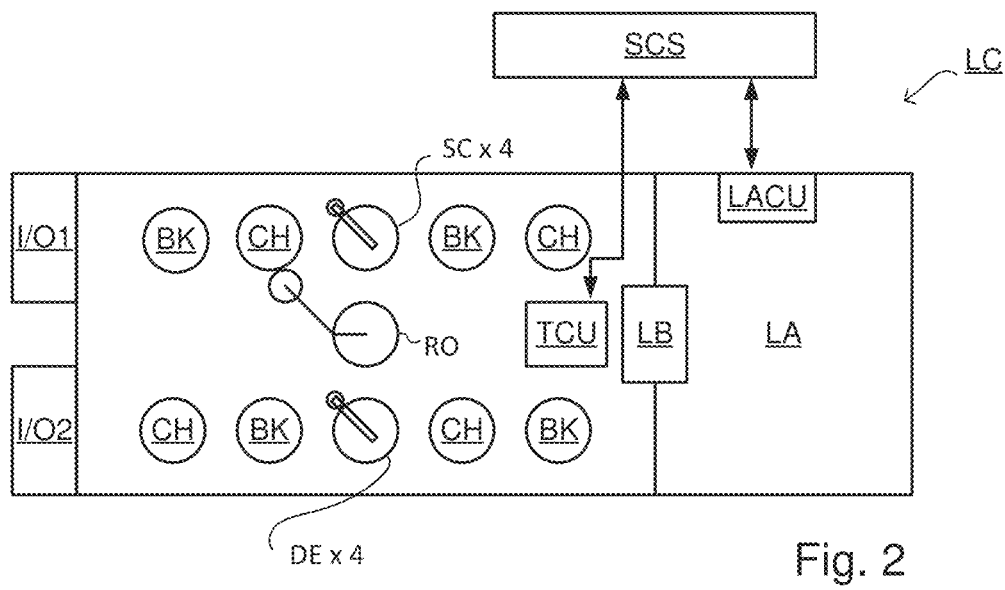
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
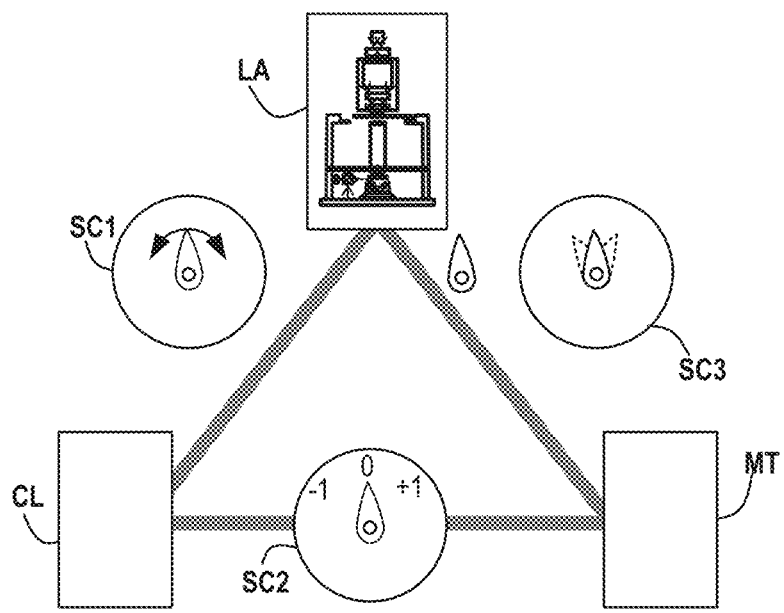
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers can measure in one image multiple targets from from multiple gratings using light from soft x-ray and visible to near-IR wave range.

Figure 4:
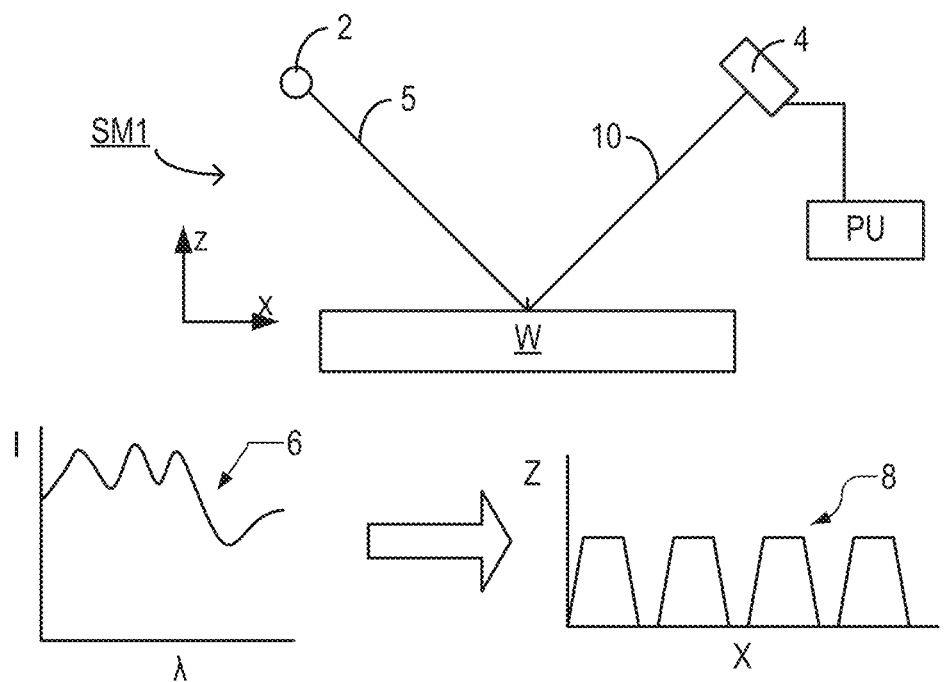
FIG. 4 illustrates an inspection apparatus according to an embodiment of the invention.

A metrology apparatus, such as a scatterometer, is depicted in FIG. 4. It comprises a broadband (white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength $\lambda$) of the specular reflected radiation 10. From this data, the structure or profile 8 giving rise to the detected spectrum may be reconstructed by processing unit PU, e.g. by Rigorous Coupled Wave Analysis and non-linear regression or by comparison with a library of simulated spectra. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

An alternative metrology apparatus suitable for use in embodiments of the invention is shown in FIG. 5(a). A target T and diffracted rays of measurement radiation used to illuminate the target are illustrated in more detail in FIG. 5(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 5(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line+1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 5(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 5(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 5 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 5) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

FIG. 6 shows an exemplary EUV metrology apparatus 300 provided for measuring properties of a metrology target T formed on substrate W according to other embodiments. The apparatus can be used as an example of EUV metrology apparatus 244 for measuring parameters of substrates W processed in the manufacturing system of FIG. 1. The illumination radiation used by EUV metrology apparatus may comprise radiation in the wavelength range from 0.1 to 100 nm, or, optionally, in the wavelength range from 1 to 100 nm or, optionally, in the wavelength range from 1 to 50 nm, or optionally, in the wavelength range from 10 to 20 nm. Various hardware components are represented schematically. The practical implementation of these components can be performed by the relevant skilled, persons applying a mixture of existing components and specially-designed components, according to well-known design principles. A support (not shown in detail) is provided for holding the substrate at a desired position and orientation relative to other components to be described. A radiation source 330 provides radiation to an illumination system 332. Illumination system 332 provides a beam of EUV illumination radiation represented by ray 304 which forms a focused irradiation spot on target T. Illumination system 332 also provides the reference spectrum 320 to reference spectrum detector 314. Components 312, 313 etc. may be conveniently considered as a spectrum detection system 333.

Substrate W in this example is mounted on a movable support having a positioning system 334 such that an angle of incidence α of ray 304 can be adjusted and/or the x, y, z position of the substrate W can be adjusted. In this example, it is chosen as a matter of convenience to tilt the substrate W to change the incidence angle, while the source 330 and illumination system 332 remain stationary. In order to catch the reflected ray 308, detection system 333 is provided with a further movable support 336, so that it moves through an angle 2α relative to the stationary illumination system, or through an angle α relative to the substrate. In the grazing incidence regime of reflectometry, it is convenient to define the incidence angle α by reference to the plane of the substrate, as shown. Of course, it could equally be defined as an angle between the direction of incidence of incident ray I and a direction N normal to the substrate.

Additional actuators, not shown, are provided for bringing each target T into a position where the focused spot S of radiation is located. (Looking at it another way, to bring the spot to the position where the target is located.) In a practical application, there may be a succession of individual targets or target locations to be measured on a single substrate, and a succession of substrates too. It is immaterial, in principle, whether the substrate and target are moved and reoriented while the illumination system and detectors 313, 350 stay still, or whether the substrate stays still while the illumination system and detectors 313, 350 are moved, or whether different components of the relative movement are achieved by a combination of these techniques. The present disclosure encompasses all these variants.

The radiation reflected by target T and substrate W is split into a spectrum 310 of rays of different wavelengths, before it impinges on spectrum detector 313. Spectrum detector 313 and/or diffraction order detector 350 comprises for example a position-sensitive EUV detector, typically an array of detector elements. In each case, the array may be a linear array, but in practice a 2-dimensional array of elements (pixels) may be provided. Spectrum detector 313 and/or diffraction order detector 350 may be for example a CCD (charge coupled device) image sensor.

A processor 340 receives signals from the detectors 350, 313 and 314. In particular, signal ST from spectrum detector 313 represents the target spectrum, signals SF from diffraction order detector 350 represents the higher order diffraction patterns and signal SR from detector 314 represents the reference spectrum. Processor 340 can subtract the reference spectrum from the target spectrum to obtain a reflection spectrum of the target, normalized against variation in the source spectrum. The resulting reflection spectra for one or more angles of incidence are used in the processor to calculate a measurement of property of the target, for example CD or overlay. Similarly, Processor 340 can subtract the reference spectrum from the higher diffraction order patterns (spectra) 352 to obtain higher order diffraction patterns which are normalized against variation in the source spectrum. These higher diffraction order patterns 352 can be compared in intensity asymmetry measurements to calculate a measurement of property of the target, for example overlay or focus.

In practice, radiation from source 330 may be provided in a series of short pulses and signals SR and ST may be captured together for each pulse. Difference signals for each individual pulse are calculated, before being aggregated into an overall reflection spectrum for this target at this angle of incidence. In this way, instability of the source spectrum between pulses is corrected for. The pulse rate may be thousands, or even tens of thousands per second (hertz). The number of pulses aggregated to measure one reflection spectrum may be tens or hundreds, for example. Even with so many pulses, the physical measurement takes a fraction of one second.

Applying this EUV spectroscopic reflectometry to metrology in semiconductor manufacturing, small grating metrology targets can be used. Multiple diffraction spectra are captured using detectors 350, 313 and 314, while setting the grazing angle of incidence α to various different values.

Using the spectra detected by spectrum detector 313 and a mathematical model of the target structure, reconstruction calculations can be performed to arrive at measurement of CD and/or other parameters of interest. Alternatively or in addition, complementary higher diffraction orders detected by diffraction order detector 350 may be compared to determine asymmetry in the target structure, and therefore one or more related parameters of interest such as overlay, focus or dose, depending on the target properties.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. A similar method may be used to measure focus on special targets which are formed with a focus dependent asymmetry. In the overlay case, the two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Figure 7:
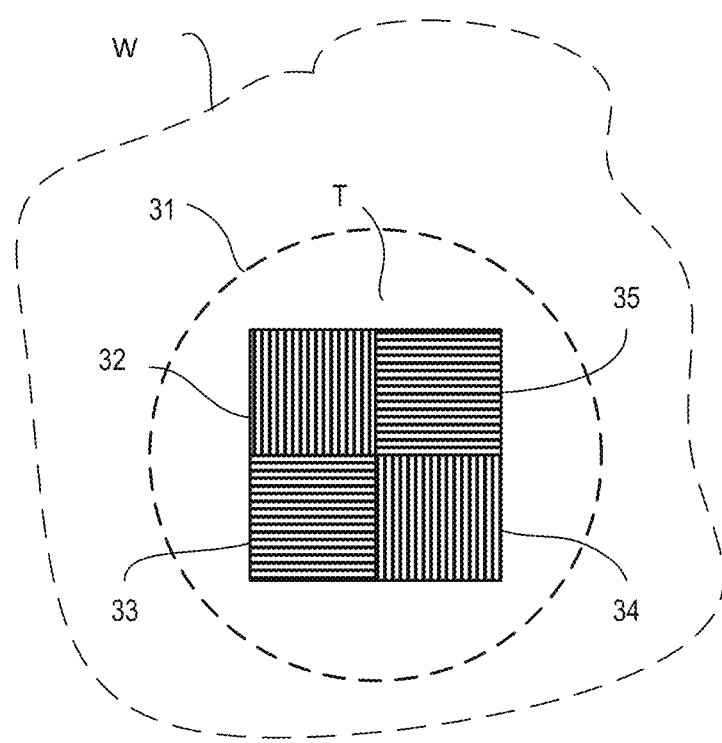
FIG. 7 depicts a known form of multiple grating target and an outline of a measurement spot on a substrate.

FIG. 7 shows an exemplary metrology target T on a substrate W, such as which may be used to measure overlay. The target T may comprise an ensemble of composite gratings or sub-targets 32, 33, 34, 35, formed by a lithographic process, mostly in resist, but also after an etch process for example. For overlay applications, the sub-targets 32, 33, 34, 35 may a pair of similar gratings (same pitch, CD, SWA, etc.) formed on the same position on the wafer in different, but not necessarily consecutive, layers. The metrology apparatus will measure the misalignment between these two overlapping gratings, known as overlay measurement. In an embodiment, the target T may be designed for dark field measurement, using a suitable scatterometer. A dark field target will typically be made smaller than the available illumination spot 31 (typical target is 5×5 microns squared whereas an illumination spot has a diameter of 35 micrometers). As such there will be sufficient space to use multiple overlay sub-targets 32, 33, 34, 35 which can be measured at the same time, allowing measurements of multiple functionalities. Sub-targets 32, 33, 34, 35, may differ in their orientation, as shown, so as to diffract incoming radiation in X and Y directions. In the specific example illustrated, sub-targets 32 and 34 are X-direction sub-targets with biases of +d, −d, respectively, and sub-targets 33 and 35 are Y-direction sub-targets with offsets +d and −d respectively. Alternatively, measurement in only one direction would require only half the sub-targets, i.e., only those corresponding to that direction. While four sub-targets are illustrated, another embodiment may include a larger matrix to obtain desired accuracy. For example, a 3×3 array of nine composite sub-targets may have biases −4d, −3d, −2d, −d, 0, +d, +2d, +3d, +4d. Separate images of these sub-targets can be identified in the image captured by detection system.

In an embodiment, asymmetry of the target, and hence, e.g., overlay, can then be determined. This may be done using an image processor and a controller by comparing the intensity values obtained for +1 and −1 orders (or other complementary higher orders) for each periodic structure 32-35 to identify any difference in their intensity, i.e., an intensity asymmetry. The term "difference" is not intended to refer only to subtraction. Differences may be calculated in ratio form or in sum form. The measured intensity asymmetries for a number of periodic structures are used together with, if applicable, knowledge of the overlay biases of those periodic structures to calculate one or more performance parameters of the lithographic process in the vicinity of the target T. A performance characteristic of interest is overlay. Other parameters of performance of the lithographic process can be calculated such as focus and/or dose. The one or more performance parameters can be fed back for improvement of the lithographic process, used to improve the measurement and calculation process of the scatterometer itself and used to improve the design of the target T, for example.

More specifically, using for example the method described in PCT patent application publication no. WO 2011/012624 or US patent application US 20160161863, incorporated herein by reference in its entirety, overlay between the two layers containing the sub-targets 32 to 35 may be measured by a method comprising the following steps. In an initial step, the substrate, for example a semiconductor wafer, is processed through the lithographic cell of FIG. 2 one or more times, to create a structure including the target comprising periodic structures 32-35. In a next step, a first diffraction pattern from the periodic structures 32 to 35 is obtained using one of the first order diffracted beams (say −1), for example using the dark field scatterometer illustrated in FIG. 5(a). In an embodiment, a first illumination mode is used. Then, whether by, for example, changing the illumination mode, or changing the imaging mode, or by rotating substrate W by 180° in the field of view of the metrology apparatus, a second diffraction pattern from the periodic structures using the other first order diffracted beam +1 is obtained. Consequently, the +1 diffracted radiation is captured in the second image. In an embodiment, the illuminated mode is changed and a second illumination mode is used. In an embodiment, tool-induced artifacts like TIS (Tool Induced Shift) can be removed by doing the measurement at 0° and 180° substrate orientation. The first and second diffraction patterns are then compared, e.g., by calculating the differences of intensity levels within diffraction patterns of each sub-target.

Figure 8:
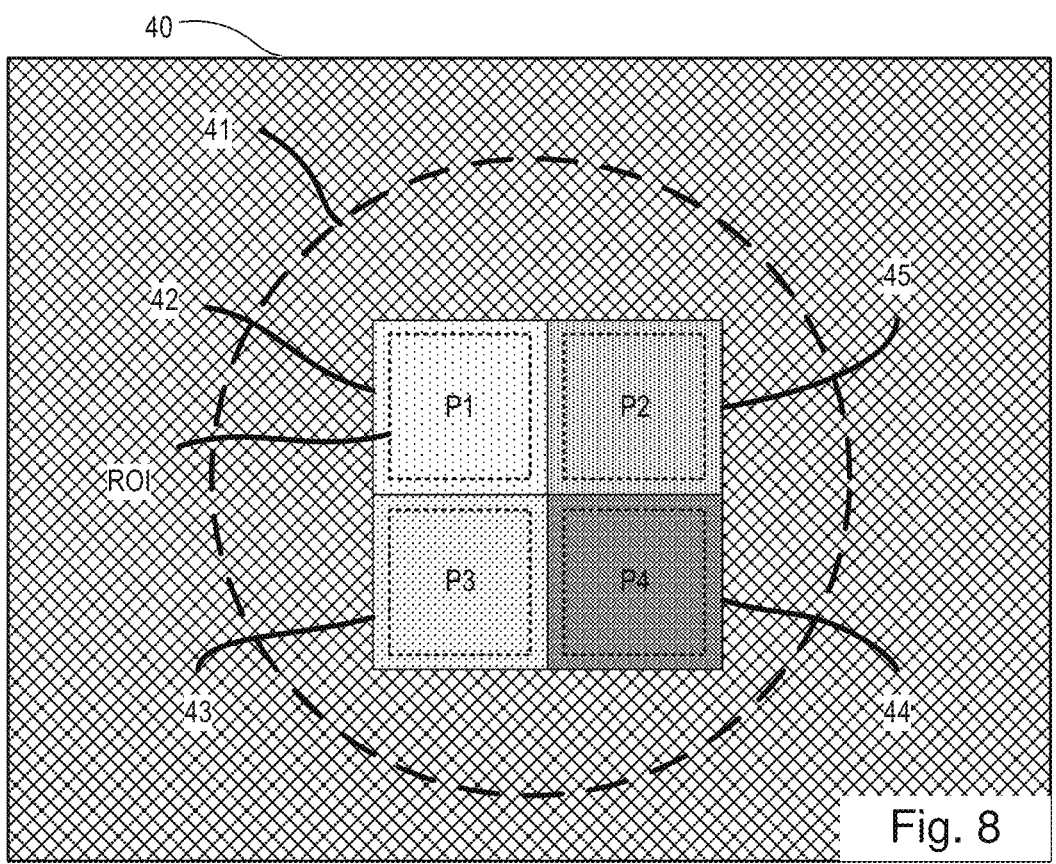
FIG. 8 depicts an image of the target of FIG. 7 obtained by a metrology method using a dark field scatterometer as illustrated in FIG. 5(a), according to at least some of the embodiments disclosed herein.

FIG. 8 shows an example of an image that may be formed on and detected by a sensor, using the target of FIG. 7 as part of the method described above (e.g., using the apparatus of FIG. 5(a)). The dark rectangle represents the field of the image on the sensor, within which the illuminated spot 31 on the substrate is imaged into a corresponding circular area 41. Within this, rectangular areas 42-45 represent the images of the small target gratings 32 to 35. If the targets are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Embodiments of the invention, which will be discussed hereinafter, may be implemented in one of the above discussed metrology or inspection apparatuses. Embodiments of the invention relate to methods and/or a metrology or inspection apparatus for determining a characteristic of interest of at least one structure (e.g., a target) on a substrate.

In present metrology apparatuses, a spatially incoherent light source is typically used. To increase the photon flux (in order to reduce the measurement time), it would be desirable to use an (at least partially) coherent light source, such as white light laser, with an AOTF (Acousto-Optical Tunable Filter) to select the measurement wavelength(s) and/or bandwidth(s). A coherent illumination source might also allow for a small illumination spot, which is also beneficial (e.g., in order to support smaller target sizes or to prevent illumination of structures neighboring the target). In addition, typically, in present metrology apparatuses, the supported wavelength range is limited to approximately 400 nm to 900 nm.

In general, the measurement of a suitably high quality intensity image of requires that the optics should have low aberration specifications over a wide wavelength $\lambda$ range, such that there is flexibility to choose an optimal measurement wavelength and/or bandwidth. A wide wavelength range will enable measurements which cover a large number of different materials, stacks and applications. At the same time, the optics should also have a large numerical aperture NA (e.g., NA>0.8) to minimize crosstalk between neighboring structures and a large field of view. Other considerations are a large dynamic range (low ghosting/reflections) and compatibility with the dark field measurement principle which suppresses the zeroth order.

It is very difficult or impossible to implement all of these requirements and desirable features in a single metrology apparatus, as many of them will impose competing requirements on the sensor optics to maintain sufficiently low aberration performance. In particular, increasing the wavelength range of the illumination radiation significantly beyond the present 400 nm to 900 nm, while meeting the other requirements, will worsen the aberration performance of the sensor optics. This will result in increased aberrations, which in turn will worsen the detector intensity image quality.

In particular, it is desirable to facilitate a larger wavelength range, for example 200 nm to 2000 nm), in combination with a large field of view (>50 μm). Rather than attempt to achieve this optically while maintaining aberration performance, it is proposed that this be achieved by allowing the sensor optics to have greater aberrations. Of course, simply allowing larger aberrations within the sensor optics will have an unacceptable impact on the image quality unless something is done to compensate for the effect of these optical aberrations. Therefore, it is proposed to use computational imaging techniques to compensate for the negative effect of relaxation on aberration performance within the sensor optics.

As such, it is proposed to use computational imaging in a metrology apparatus for measuring a structure on a substrate (e.g. a wafer comprising semiconductor material) formed using a lithographic process. A previous solution for doing this comprises performing a phase retrieval, based on an (e.g., relatively lower quality) intensity measurement, which describes the interaction of target and illumination radiation in terms of electric field amplitude and phase. Such a method, for example, is disclosed in European Patent Applications EP17199764.6, filed 2 Nov. 2017, and EP17206967.6, filed 13 Dec. 2017, which are incorporated herein by reference.

More specifically, such phase retrieval techniques comprise a calibration phase where the aberrations of the optical element are estimated via a mathematical optimization. This estimated information describing the sensor imperfections is later used to numerically invert the effect of the imperfection to recover an image with sufficient quality for metrology, e.g., to calculate overlay or focus. However, the complexity of the algorithms used in calibration and image post-processing phase can be so great that, to reduce the calculation time to an amount acceptable, additional computational hardware (for instance in the form of extra GPUs) is required. The additional costs determined by this additional hardware will reduce, or even overcome, the benefit of a lower-cost sensor.

To address this, a different approach to computational imaging, based on deep learning techniques, is now proposed. The proposal may comprise using a deep neural network to extract metrology (e.g., overlay, focus, dose, aberration or any other characteristic of interest) information directly from a low-quality image acquired using a low cost imaging sensor. The image may be of a standard (micro) DBO (diffraction based overlay) target such as illustrated in FIG. 7 or (micro) DBF (diffraction based focus) target. Also proposed is a metrology system for determining a characteristic of interest relating to at least one structure on a substrate formed by a lithographic process, the metrology apparatus comprising a trained neural network (which may comprise a data structure saved on a data storage medium); and a processor being configured to obtain an input image of the structure; and use the trained neural network to determine the characteristic of interest from said input image.

In order to train the deep neural network, a calibration phase is proposed. In the calibration phase, the network learns how to calculate overlay or focus values from low-quality images while correcting for the aberrations of the low-cost optics used. Since the sensor optics may be relatively simple (in some cases, comprising only a single optical element), it may be assumed that all individual sensors produced for a particular class of sensors (and therefore a class of metrology tools) will have very similar aberrations. In such an embodiment, the calibration phase may be performed per class of sensors (e.g., at the metrology tool production facility) during qualification of one (or a representative few) of the sensors comprised within a class of sensors. Alternatively, (e.g., where it is determined or believed that the sensor-to-sensor performance variation is too great), a calibration can be performed to specifically train a network for each individual sensor. The procedure, while time consuming, can be fully automated and needs to be performed only during production of the metrology tool.

Figure 9:
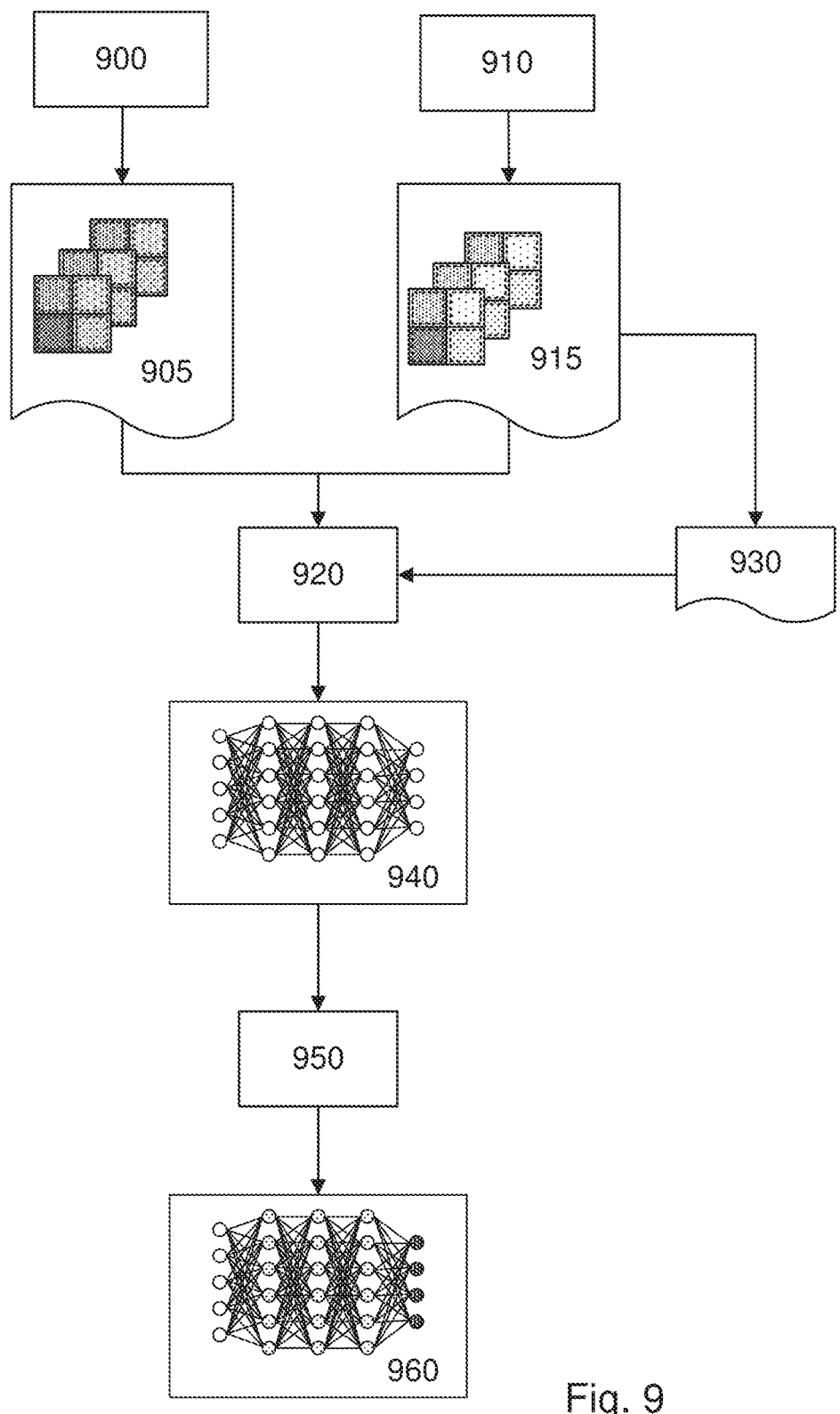
FIG. 9 schematically depicts a calibration method according to, or forming part of, an embodiment of the invention.

FIG. 9 is a flow diagram illustrating the steps of such a calibration phase. At step 900, first training images 905 (e.g., of one or more calibration structures such as metrology targets) are acquired. At step 910, second training images 915 (e.g., of one or more calibration structures such as metrology targets corresponding to those of the first training images 905) may also be acquired.

The first training images 905 may comprise relatively low-quality images acquired using a metrology tool comprising simplified, relatively lower-quality optics (referred to herein as a computational imaging sensor as it designed to be used in combination with computational imaging enhancement techniques). The second training images 915 may be obtained using a conventional metrology tool comprising high quality optics having minimal aberrations. Step 910 is most relevant for characteristics of interest such as overlay, where reference values need to be measured. For focus or dose, for example, this step can be replaced (i.e., second training images 915 may not be required) by simply obtaining the actual focus and dose settings from the lithographic apparatus (scanner) used to form the target. However, in other embodiments, step 910 may still be performed even where the characteristic of interest is focus/and or dose, to measure reference focus/dose values which account for drift in actual focus/dose from the scanner setting. The characteristic of interest should be varied between acquisition of each of the second training images 915 (whether natural variation or deliberate variation).

Where second training images 915 are also acquired, the second training images 915 should correspond to the first training images 905 (e.g., same settings and target(s)). It is proposed that each image of the first training images 905 and second training images 915 comprise the whole image, rather than only selected relevant information (e.g., a region of interest). At step 920, known reference values (golden reference values) of the characteristic(s) of interest overlay and/or focus) are obtained. For overlay, a golden reference algorithm may be used to extract golden reference values from the second training images 915. The golden reference algorithm may be any known algorithm for determining overlay from metrology images (e.g., asymmetry in said images). For example, a method for calculating overlay such as described in WO2015/018625, incorporated herein by reference, may be used. Such a method may comprise regressing through a plot of intensity asymmetry in a first target or sub-target (e.g., having a first bias +d) against intensity asymmetry in a second target or sub-target (e.g., having a second bias −d), for a number of different illumination characteristics, with overlay being indicated by the slope of the regression. Intensity asymmetry is the difference (or other comparison measure) between intensity of a positive diffraction order (e.g., +1) of radiation diffracted by the target and intensity of the corresponding negative diffraction order (e.g., −1) of the radiation diffracted by the target.

For focus, golden reference values may comprise the known focus settings of the lithographic apparatus, or determined from the second training images 915 using an appropriate known golden reference algorithm (e.g., using known techniques such as Bossung, curve analysis or diffraction based focus). The second training images 915, along with their associated overlay/focus values can be stored in a database for future use, 930. The first training images 905 acquired using the simplified optical sensor are then fed 940 to the network along with the corresponding overlay and/or focus values determined at step 920. The deep layers of the network then learn 950 how to extract the characteristic(s) of interest (e.g., overlay, focus, critical dimension, one or more other parameters relating to 3D reconstruction of a structure, Line Edge Roughness (LER) Line Width Roughness (LWR), aberrations, an illumination characteristic (e.g., energetic or geometric non-telecentricity), and/or any 2D contour parameter) from aberrated images such as the first training images 905. In this context, one or more other parameters relating to 3D reconstruction of a structure may describe any of the parameters which presently are determined/modeled using reconstruction techniques. In such reconstruction techniques, the structure is modelled as a 3D structure (e.g., as a line/a number of lines having certain fixed and variable parameters such as linewidth, pitch, length, height, side walls angles, degrees of rounding between surfaces (e.g., between side walls and top surface) etc.). Scattering of radiation by this 3D structure is simulated and a resultant simulated image is compared to a measured image of the structure being measured. One or more of the variable parameters is/are then adjusted and the simulation repeated iteratively so as to minimize the difference between simulated and measured images. It is proposed that the characteristic of interest may be one or more of these parameters, possibly obviating the need for reconstruction (which is computationally intensive).

Following completion of this calibration phase, the algorithm comprising the trained network 960 is ready for use (e.g., shipment). Since the network should provide a continuous output, it is proposed that the last layer (output) of the network will be a regression layer.

Figure 10:
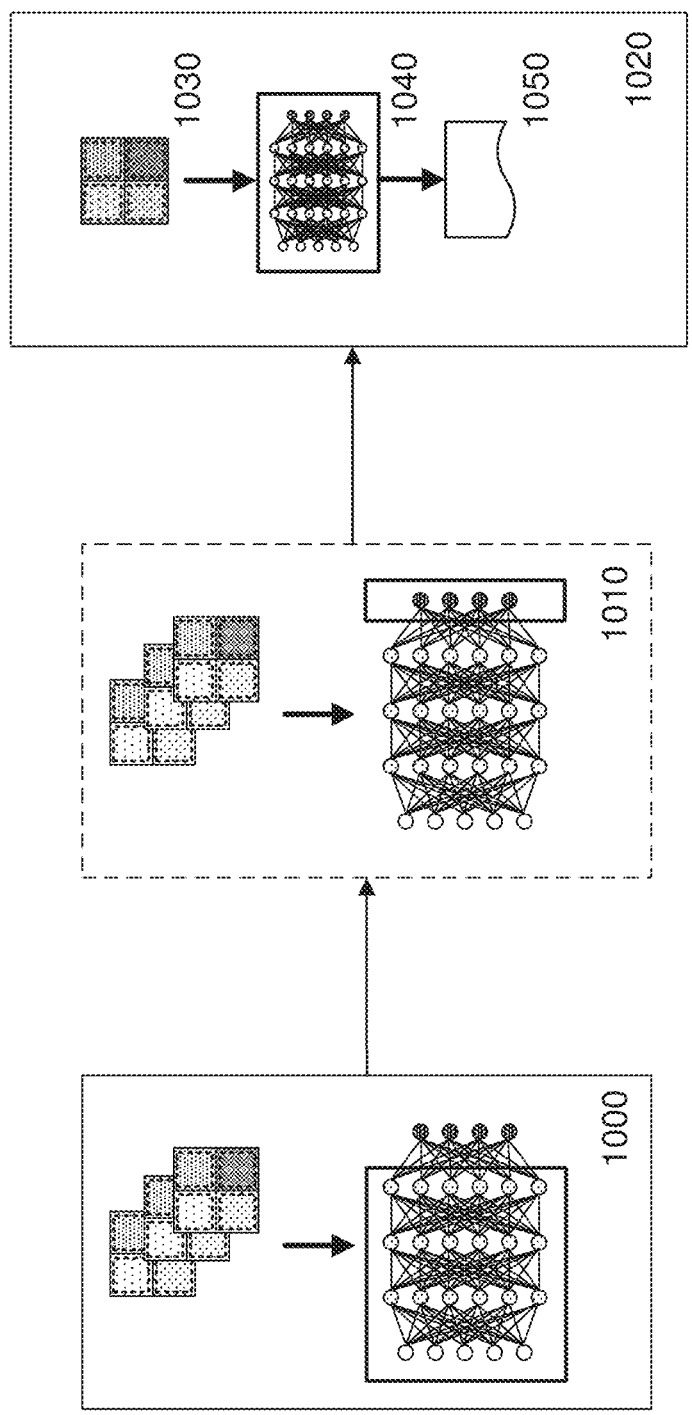
FIG. 10 schematically depicts a calibration and metrology method according to an embodiment of the invention.

FIG. 10 is a flow diagram illustrating a complete calibration and use flow of the neural network according to an embodiment. There are three phases: the first phase 1000 comprises the initial calibration and training as already described above and illustrated by FIG. 9. Once the network is trained, it can be supplied with (or as part of) a product or metrology tool comprising the simplified optical sensor associated with the network. An associated network in this context may be a network associated with (trained to) the type or class of optical sensor generally, or to the specific individual sensor. Phase 1010 comprises an optional, additional process calibration. This may comprise performing, e.g., during a process set-up phase, an additional training step for the final layer or layers. This training step may use a technique called "transfer learning", so as to specialize the final layer(s) of the network for specific lithographic steps relevant to a particular process which is to be performed. Transfer Learning is a known technique for training only the last few layers (or output layer) of a neural network so as to specialize it for specific images. The training images may comprise corresponding sets of high quality and low quality images relevant to the particular process for which the neural network is being specialized, so as to train these last few layers in a manner similar to the initial calibration 1000. Since only the last layers of the network are trained, this phase requires much less time than the training of the deep layers performed at phase 1000. It may be that this process calibration of the network via transfer learning will not always be necessary. Whether phase 1010 is performed will depend on the difficulty/complexity of the relevant process which will be monitored by the metrology tool.

Once this process calibration 1010 has been carried out (if performed at all), the product containing the computational imaging sensor and the related neural network can be used to perform metrology 1020, as part of (for example) a lithographic process monitoring application. Metrology 1020 may comprise obtaining an input image 1030 of a structure (e.g., target) on a substrate being measured. The input image 1030 may comprise an aberrated image obtained from the simplified sensor. The input image 1030 may then be fed as an input into the trained network (step 1040). The input image 1030 may comprise the whole image (all information) rather than only a region of interest. At step 1050, the trained network will output a value for the characteristic(s) of interest.

The above approach can be modified to develop an expanded deep neural network, developed to handle a vector of images (e.g., for said calibration structure or sample of calibration structures) taken at multiple illumination characteristics (e.g., wavelengths and polarizations) of measurement illumination (e.g., used to illuminate a target during a measurement). Such an approach may be beneficial, for example, for product layers of which high quality images (for training the network) are not available, for example due to process effects and specific lithographic steps. The resultant network is effectively an expansion of the neural network of the previous embodiment. For training of this network, a golden reference for the characteristic of interest may be obtained using an accurate reference apparatus/method, such as scanning electron microscopy (SEM, e.g., CD-SEM): once trained, the network can then be used:

for a multi-wavelength measurement of a characteristic of interest; and/or as a reference to choose the best characteristic of interest profiles obtained from a computational imaging sensor and related neural network as described in the preceding embodiment (each profile relating to a specific illumination characteristic).

Furthermore, in order to boost the overall learning process, in addition to images obtained using the computational imaging sensor, additional inputs and/or information can be supplied to the deep neural network. The additional information can be, for example, the corresponding location of targets (training samples) on a substrate and/or a regularization based on images corresponding to neighboring targets (e.g., imposing a prior information constraint based on each target's similarity to the other targets).

It will be appreciated that any of the neural networks described herein may comprise a deep residual neural network. This may improve convergence time and simplify the network optimization. A deep residual neural network may have increased depth without a corresponding additional cost, compared to learning the parameters for each layer from scratch. In an embodiment, the training may be performed on perturbations around identity mappings. Deep residual neural networks are good candidates for extracting discriminative features from images comprising a characteristic of interest, as a conventional deeper neural network would be more difficult to train.

In some situations it may not be possible to obtain suitable high quality (second) training images. This can be the case when one or more of the applied lithographic layers are opaque to the metrology tool (using conventional measurement illumination). In such a situation, the calibration phase illustrated in FIG. 9 may be adapted to include a computational imaging process (e.g., a phase retrieval such as disclosed in the aforementioned patent applications EP17199764.6 and EP17206967.6) on the training images. In such a method, initial raw training images may be obtained using a metrology device having a sensor able to support an extended range of frequencies in the infrared part of the spectrum. In an embodiment, such a sensor may comprise a computational imaging sensor similar to or the same as that used to obtain the first training images. The infrared illumination is able to penetrate such "opaque" layers and therefore will be able to capture images from these opaque layers. Such raw training images will be affected by aberrations. Therefore, it is proposed that a phase retrieval approach (or other suitable computational imaging technique) is used to improve the image quality (e.g., by correcting for the aberrations in the raw images) to obtain the second training images. The retrieved (cleaned) high quality images can then be used in place of the second training images in FIG. 9, e.g., analyzed using golden reference algorithms to determine the associated parameters of interest, with the process flow being otherwise the same. In such an embodiment the second training images may be computationally enhanced (e.g., phase retrieved) versions of the first training images.

Such an embodiment is characterized by a hybrid use of more conventional computational imaging (e.g., phase retrieval) and deep learning approaches and therefore benefits from both of these methods. Similar alternative embodiments combining the two approaches in different ways can also be envisaged; for example, when learning is supported or facilitated by using traditional signal or image processing techniques to process the training images so as to improve their quality. In certain embodiments, a hybrid approach may use low quality images obtained via a computational Imaging setup subsequent to them being improved using any possible mathematical/signal processing means.

The embodiments of the invention described above are characterized by the fact that the output of the neural network is a single characteristic of interest. In another embodiment, the output of the neural network may comprise a complete new image reconstructed from the low quality image as measured, in addition to one (or more) parameters of interest. Such an embodiment may, for example, use an encoder-decoder (or autoencoder) deep-learning network. With this approach, essentially all information contained in the measured image is encoded. The encoding can be interpreted as a form of information compression. Thus, the encoding can be used to encode characteristic(s) of interest information that is present in the measured image. The encoding can also be employed to project or decode to a higher quality, super-resolved image. This network is trained by providing labeled characteristic of interest data (e.g., values of the characteristic of interest as determined from the second training images) in addition to the image pairs: pairs of corresponding images from the first training images and second training images as described in relation to FIG. 9. Therefore, in comparison to the calibration method of FIG. 9, the second training images are used to train the network in addition to parameter values determined from these second training images, and the first training images. Ultimately, given a degraded measured image, the network will be able to predict multiple parameters of interest (e.g., both overlay and focus) and additionally output a "clean" image that corresponds directly to the determined parameter values. As such, this method may be used as an alternative to phase retrieval techniques for obtaining high quality images from lower quality sensors.

In addition, because an encoder-decode type network minimally comprises all the information contained in the image, the training can be separated. For example, training the network to map measured (lower quality) images to the higher quality images may be performed separately to training the network to map the encoding layer to various scalars (e.g., the characteristic(s) of interest).

This encoding also allows for encryption (of the compression) of the image. It also allows for fault detection of images. Essentially the encoding vector describes the state of the metrology system. As such, it can be utilized as part of a state estimation and control system and can be driven by exogenous inputs, such as focus or dose.

The above described utilization of neural networks in metrology allows determination of values of a characteristic of interest (e.g., overlay, focus, critical dimension, one or more other 3D reconstruction parameter(s), Line Edge Roughness (LER) Line Width Roughness (LWR) aberrations, non-telecentricity (energetic or geometric) and/or any 2D contour parameter) on production wafers with increased speed and less computational power and cost compared to traditional algorithms used in computational imaging. This is beneficial for reducing computational hardware cost.

More specifically, the above proposal transfers the demanding computational element from the moment of usage of the metrology tool (e.g., during wafer production monitoring) to the moment of initial production of the metrology tool. As such, the cost of the additional processing (e.g., extra CPUs) will be shared among multiple sensors, hence reducing the cost per sensor and the cost of ownership. This is due to the fact that training a network can be a very time-consuming procedure, but usage of the network once trained is extremely fast and cheap. Also, deep neural networks do not need the minimum variance unbiased estimators that other approaches need and naturally allow a better trade-off between repro and variance.

The trained neural network concept can be also used in a traditional (i.e., non-computational imaging) setup as an alternative to state of the art algorithms to extract overlay and/or focus information (or other characteristic of interest) from high quality images. In particular, an embodiment will now be described which improves on the accuracy of such state of the art algorithms e.g., such as described in the aforementioned PCT application WO2015/018625.

Methods such as WO2015/018625 (for measuring overlay), or similar methods for measuring focus, describe measuring diffraction asymmetry from scatterometry targets based on a simplified model of diffracted radiation from the target gratings. Both single and multi-wavelength methods currently employed rely on such simplified models. Due to the limitations of the simplified physical models, process effects (such as various types of target asymmetries) and sensor asymmetries can have a negative impact on the accuracy of the estimation of the characteristic of interest (e.g., overlay or focus). Attempts have been made to improve the accuracy of the physical models, for example, by using key performance indicators (KPIs) to evaluate and optimize the wavelength(s) of the measurement illumination. However, there is a limit to how much improvement is possible using such methods, while attempting to physically model all asymmetries is impractical or impossible. Solving the associated mathematical problem would require the processing of an impractical amount of information describing the stack and an overly computationally complex electromagnetism simulation, or else will result in the number of unknowns exceeding the number of available observations/measurements.

Therefore it is proposed to use deep learning methods which are able to model and learn complex nonlinear mappings from diverse observations relating to the parameters of interest, and which can then be applied to new data. It can be demonstrated that the resultant trained model, and an associated machine learning based characteristic of interest estimation scheme (e.g., for overlay or focus), is not overfitted and demonstrates extremely accurate overlay or focus estimation, even on other stacks and layers where no reference values are provided.

The main concept is to use reference data (e.g., image data or mean intensity data) relating to various reference examples (e.g., various reference or target geometries), each having a corresponding reference value for a characteristic of interest, i.e., an accurate or known value for the characteristic of interest. The reference data may further relate to various measurement illumination characteristics (e.g., multiple wavelengths/polarizations/angles of incidence or intensities). The targets may, for example, comprise overlay or focus targets such as DBO/DBF targets, for example similar to that illustrated in FIG. 7 for overlay. Using this reference data, a feature space for a deep neural network is formed.

Using the reference values and reference data, the neural network is trained to predict the reference values from the reference data.

The reference data may be obtained from a simulation environment, e.g., the target geometries and measurement responses (parameter data) may be simulated. Such a simulation environment may be similar to that used presently for reconstruction techniques, e.g., using a Maxwell solver such as rigorous coupled-wave analysis (RCWA). Alternatively, or in addition reference data may be obtained from accurate metrology (e.g., scanning electron microscope (SEM) measurements) and/or be based on a KPI criteria such as an expected overlay consistency in neighboring targets and/or from wafer to wafer.

It is therefore proposed to use reference data (e.g., diverse or big data) from multiple reference examples (reference geometries and/or stacks, whether simulated and/or real), to train the neural network. The resultant trained neural network will have learned the relevant interactions and behaviors from the reference examples. As such, the neural network will learn the effect on the measurement illumination (and therefore on the resultant measurement images/intensities) of the full system including stack, target and sensor. More specifically, the neural network learns, for example:

The various stack behaviors,
Interactions of target and stack,
Various target/grating asymmetries and their impact on the image (or mean intensity data as appropriate), and
The sensor imperfections and how these interact with the various stack and target geometries.

By way of example, a deep neural network may be trained on one or more (e.g., simulated) stacks using a large number of diverse target geometries. The different target geometries may comprise, for example, different heights and different grating asymmetries; e.g., different side wall angles and/or bottom floor tilts. The network may also be trained on measurement of such targets using varied measurement illumination characteristics (e.g., variation in one or more of: different wavelengths, different polarizations, different incident angles, different intensities and/or different combinations thereof). The number of target geometries used to train the network may be in the tens, in the hundreds or in the thousands, for example, each having a corresponding reference value for the characteristic of interest.

It can be shown that the parameter estimation performance of neural network trained in this manner may be between 1 and 3 orders of magnitude more accurate than present (e.g., overlay) estimation techniques, in terms of mean $3\sigma$ in the estimation error, i.e., the difference between the estimated overlay and reference overlay/imposed bias. Better estimates and greater accuracy gains are observed, in particular, when there is greater reference diversity, i.e., there is greater diversity in the reference structures used to train the network. For example, the estimation performance may be improved if the training is performed using targets from different stacks (i.e., in different layers) rather than targets all from a single stack (single layer). However, even when training is based on reference data relating to only a single stack, the estimation accuracy is improved significantly compared to present methods.

An interesting observation is that the trained network demonstrates a good estimation performance (i.e., better than present estimation methods) for targets in different stacks than the stacks used in training (i.e., any of the stacks comprised in the reference data). Therefore, it is not required that the reference data relate to the same stack as the target being measured. Estimation accuracy remains good where no stack information nor reference overlay for any of the targets being measured is known to the trained network.

In addition, with respect particularly to overlay metrology, which typically uses a pairs of targets (per direction), each having a different bias, the neural network can be trained on single targets, or single targets per measurement direction where more than one direction is being considered. The targets may have a bias or have no bias. Therefore, the trained neural network can be used to estimate the characteristic of interest from measurement targets having only a single grating pair (gratings in different layers) per measurement direction. Consequently, the target size can be significantly reduced (effectively halved in area) with respect to the two-bias target designs used presently.

The method can be used on intensities only, or may be extended to use the full image information available. In the latter case, deep convolutional neural networks can be trained, which are envisaged to be more robust to process effect and sensor camera imperfections.

In summary, the embodiments described above provide very significant accuracy gains (compared to present methods) in estimation of overlay or other characteristic of interest, and are significantly robust to various process effects and/or target/sensor asymmetries. Furthermore these methods are data driven and not stack information dependent, and provide a complex modeling framework which is generic, rather than case dependent such that performance is remains at a very high level on new substrates and/or stacks for which no reference data is available. In addition, measurement speed is improved enabling faster inline overlay measurement; once the network has been trained, it can be used immediately without online training or optimization/calibration. Finally, targets can be made smaller as single-bias targets can be used.

A further application of machine learning techniques, such as neural networks or inference models, is to determine a characteristic of interest, more specifically focus based on more than two, and in particular significantly more than two, different features on a substrate, each having a different sensitivity to the characteristic of interest.

Measuring focus from a feature (i.e., the focus setting of the lithographic apparatus which formed the feature) is often performed by measuring the critical dimension (CD) of a feature, e.g., a line/space periodic feature, as CD varies predictably with focus (this variation being typically characterized by a Bossung curve, as is well understood). It has been observed that measuring focus using only 1 or 2 line/space periodic features provides less than ideal results, particularly when the structures have been formed using EUV lithography techniques due to the smaller structures and thinner resists involved in EUV lithography. In particular, it is a major challenge to determine on which side of the peak of the Bossung curve, a measured focus corresponds (i.e., is it + or − defocus).

Therefore, measuring a characteristic of interest such as focus, dose, an illumination characteristic and/or projection system (lens) aberrations of the lithographic system using a significantly greater number of features is proposed. Such a method may comprise measuring a target comprising a variety of different (e.g., periodic) features having different sensitivities to a characteristic of interest (particularly focus and/or dose, although illumination characteristics such as telecentricity or projection optics aberrations can also be monitored in such a manner). The multi-sensitivity target may comprise more than two features with different sensitivities to the characteristic(s) of interest, more than three features with different sensitivities to the characteristic(s) of interest, more than five features with different sensitivities to the characteristic(s) of interest, more than ten features with different sensitivities to the characteristic(s) of interest, more than twenty features with different sensitivities to the characteristic(s) of interest, or more than thirty features with different sensitivities to the characteristic(s) of interest. In an embodiment, all (or some) of the periodic features with different sensitivities may be repeated for a second (e.g., orthogonal) direction. For example, each of the different periodic features may be repeated in horizontal and vertical directions. Diagonal periodic features (e.g., 45 degrees) for some or all of the sensitivities may also be included, for example to separate out or add sensitivity for Z6 aberration. Alternatively, a target comprising a set of gauges could be used.

The different sensitivities may be implemented by dividing the target into different regions, each region having different values for certain structural parameters of the periodic features. For example the regions may comprise line-space periodic features which vary in terms of pitch and/or critical dimension (CD) per region. A number of different types of features may additionally (or alternatively) be included (e.g., contact hole features). Each region could each have dimensions of approximately 1×1 μm2. By such a method, multiple repetitions of all imaging features can be included.

Figures 11, 12:
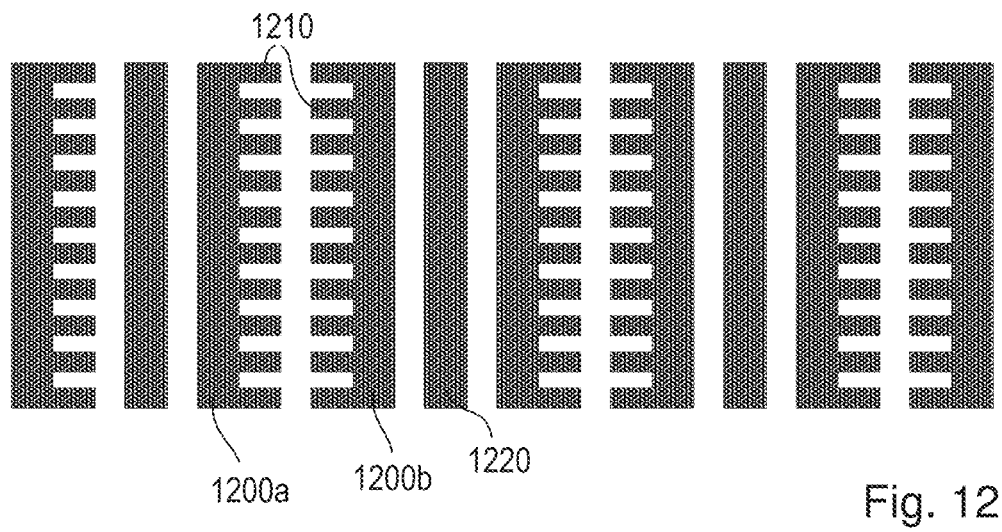
FIG. 11 schematically depicts a multi-sensitivity target according to an embodiment of the invention.
FIG. 12 schematically depicts a periodic feature which may form part of the multi-sensitivity target of FIG. 11, according to an embodiment of the invention.

FIG. 11 illustrates schematically an example of a possible multi-sensitivity target arrangement. The multi-sensitivity target in this specific embodiment comprises four different pitches p1 to p4 with 9 CDs per pitch (CD/p)1-(CD/p)9. In an embodiment, the pitches may be close to (but larger than) the resolution limit and therefore be of a scale that is representative of the actual product. Each combination results in a different sensitivity to a characteristic of interest, and in this example, each combination is provided per horizontal H and vertical V directions. A column of contact holes CH (e.g., of varying diameters) is also optionally included. This particular multi-sensitivity target is provided purely as an example of a multi-sensitivity target suitable for this embodiment. Even more specifically, and again purely for example, the pitches may comprise 25, 35, 50 and 70 nm and the CD/pitch ratios may comprise 1/16, 2/16, 3/16, 4/16, 8/16, 12/16, 13/16, 14/16 and 15/16.

Determining a characteristic of interest from such a large amount of multi-dimensional data is challenging, in particular, to separate noise from focus-specific image (bitmap) change. To address this, it is proposed to use a machine learning technique to calibrate a neural network (or inference model) in a technique similar to that described in the aforementioned embodiment (e.g., based on a known setting of the lithographic apparatus). An alternative machine learning technique may comprise performing a multi-input (n-dimensional) calibration and using the resultant relationship in determining a characteristic of interest. Such a multi-input calibration may comprise a component analysis (e.g., principal component analysis PCA) or linear discriminant analysis LDA.

It is proposed that the target metrology for the multi-sensitivity target used in this embodiment is performed using scanning electron microscopy (SEM). In particular it is proposed that a metrology image, more specifically a raw, wide field-of-view SEM image of the multi-sensitivity target is obtained under different measurement conditions during calibration, and a similar SEM image measured (e.g., on-product) during production. Wide FOV metrology (SEM) measurements are preferred to limit metrology time, although multiple standard FOV SEM measurements can also be used, as can any other suitable metrology/imaging technique capable of measuring local CD or pattern shift separately at different regions of the multi-sensitivity target. It should be noted that, in contrast to many of the embodiments described in relation to FIGS. 9 and 10 (e.g., where the proposed metrology typically uses dark-field techniques such that the structures on the substrate are not resolved in the images), a significant part of the structure of the target of FIG. 11 is resolved (e.g., when using SEM metrology) such that e.g. CDs or pattern shifts can be determined. However, in other embodiment, the multi-sensitivity target can be measured using scatterometry techniques (bright-field and/or dark-field) techniques, as appropriate. This provides a "universal" target and obviates the need for target selection (e.g., to optimize sensitivity).

The calibration step may comprise obtaining many images of multi-sensitivity targets, each image relating to a similar target formed with one or more parameters of interest varied. Where the characteristic of interest is focus, this may comprise printing the target at a number of different focus values and obtaining images of each of these. Such a method may be improved by also varying dose, i.e., exposing the multi-sensitivity targets in a focus-exposure matrix (FEM). This also enables calibration for dose in addition to focus. Additional axes can also be included, e.g., to calibration for certain aberrations in the projection optics (e.g., one or more of the Zernikes: Z5, Z7, Z8 or Z9). The calibration may be performed by exposing and measuring one or more calibration substrates.

Once the calibration images have been obtained, they can be used, along with the known focus/dose values (and aberration values as appropriate), to train a neural network in a manner similar to that already described. Alternatively, PCA or LDA techniques can be used to reduce the number of dimensions, and n-dimensional calibration curves can be determined in a manner similar to that already performed in diffraction based focus techniques (e.g., as described in U.S. Pat. No. 9,594,299B2, incorporated herein by reference), so as to correlate differences in the images to differences in the characteristic(s) of interest. In either case, the input may be the measured CD values from the multiple calibration images.

Following the calibration step, a similar multi-sensitivity target can be printed on production substrates for monitoring and/or control of the characteristic(s) of interest. A suitable metric, (e.g., CD, feature variation (e.g., pattern shift (see below)) any other reconstruction parameter, line edge roughness, line width roughness, and/or any 2D contour parameter) can be measured from the target and the trained neural network or n-dimensional calibration curve used to determine the characteristic(s) of interest from the measured metric. As in the calibration phase, metrology on the multi-sensitivity target may be performed using an SEM metrology apparatus (e.g., with a wide FOV). The metrology may be performed after-etch, so that (where focus and dose are being monitored) the determined corrections will be for effective focus or effective dose. This means that any corrections determined for the lithographic process (e.g., specifically printing/exposure) cross-compensate for other processing tool effects (e.g., etch and deposition processes).

In an embodiment, the periodic features of the multi-sensitivity target may be formed using sub-resolution features on the reticle used to print the target to boost focus sensitivity. Sub-resolution features are used in diffraction based focus ((micro) DBF) and result in a feature variation (e.g., imposed asymmetry) of a printed larger feature to which they are associated (although they are below the resolution limit of the lithographic apparatus and so will not be printed). The feature variation may comprise, for example, a feature shift or change in size (shift in center of gravity), or more generally a measurable variation in its 2D contour (more applicable to SEM type metrology). For scatterometry type metrology, the feature variation may be, for example, an asymmetry variation, side wall angle variation or variation in any other 3D reconstruction parameter.

Asymmetric placement creates a center of mass shift and a corresponding pattern shift. In such an embodiment, in addition (or alternative to) measuring CD from the images, feature variation (e.g., pattern shift) can be measured. Mirrored targets may be used to distinguish between multiple imaging and/or the parameters being determined. For example, to separate the effect of focus from coma. Inclusion of a simple line enables separation of focus from dose. Therefore, such a target enables focus metrology that is both coma and dose independent. Of course, separate determination of coma, dose and defocus is also possible, if calibrated for.

FIG. 12 shows a single sensitivity region example of such a periodic feature (as seen on the reticle). It shows mirrored (i.e., oppositely orientated) sub-features 1200a, 1200b, each having mirrored (i.e., oppositely orientated) sub-resolution features 1210. Alternating, or otherwise arranged in combination, with each pair of mirrored sub-features 1200a, 1200b are simple line features 1220. It is proposed that each (or some) of the line-space regions of multi-sensitivity target (e.g., as shown in FIG. 11) comprises the features illustrated in FIG. 12, having varying pitch/CD per region, as before.

Figure 13:
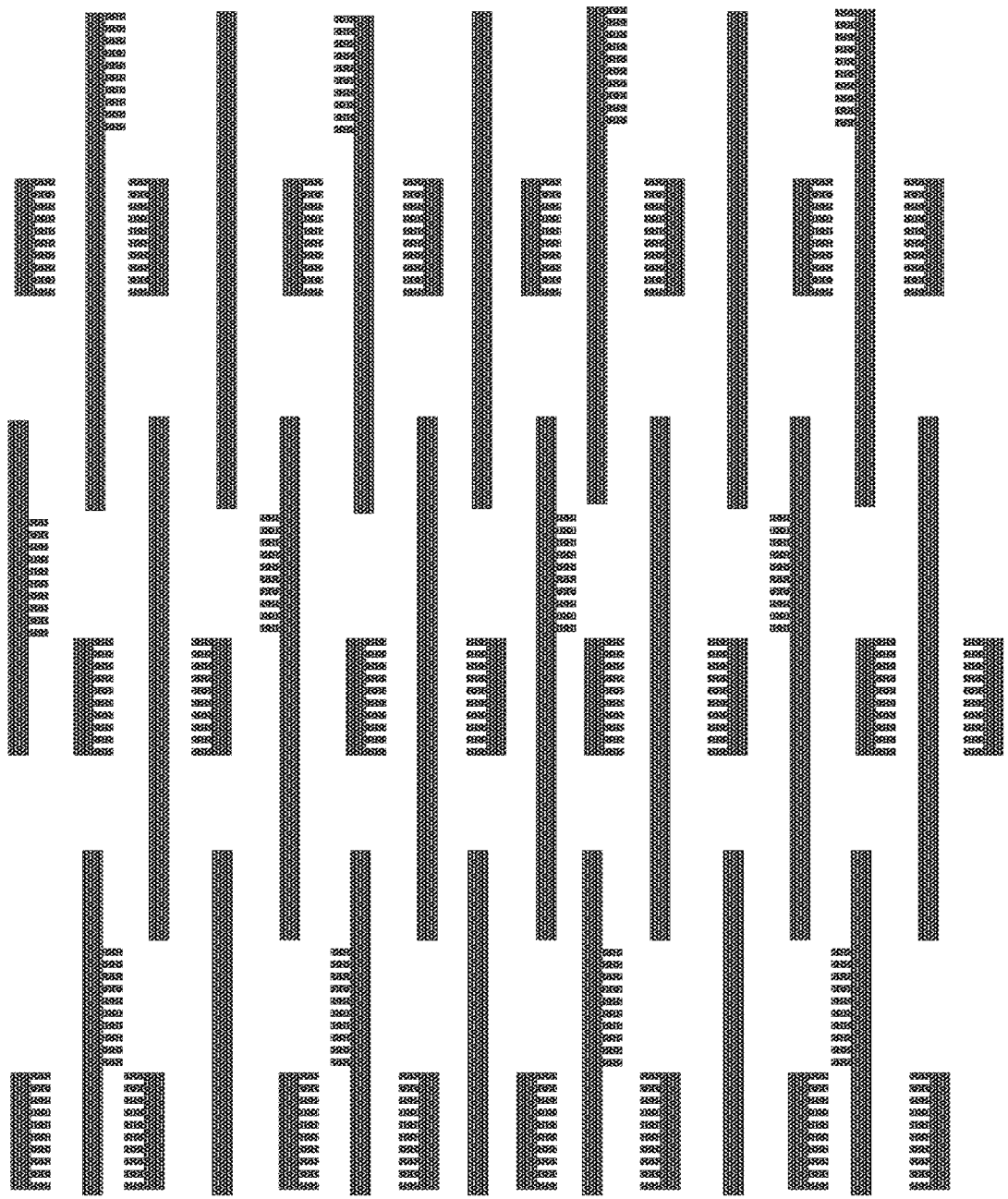
FIG. 13 schematically depicts a further periodic feature which may form part of the multi-sensitivity target of FIG. 11, according to an embodiment of the invention.

FIG. 13 illustrates an embodiment where the target comprises an additional modification to separate Z4 aberration from higher order spherical aberration (e.g., Z9). The proposed modification enables measurement of pitch and double-pitch within each region, therefore providing two very different samplings of the aberration pupil. As such, there are sub-regions (rows) having features forming a line-space periodic feature with pitch p and sub-regions (rows) having features forming a line-space periodic feature with pitch 2p. The concept can be applied to a simple line-space arrangement with simple line features only, or (as shown here) can be combined with the concepts introduced in the above example illustrated in FIG. 11 (e.g., comprising sub-resolution features, optionally mirrored and combined with simple line features). In each region, the 'pitch' (as opposed to double-pitch) is not very far from the resolution limit in order to be focus sensitive, and in order to provide a product-relevant measurement. The modification may also separate the lower order and higher order coma terms.

A further application of the machine learning/neural network techniques described herein is to determine an optimal a measurement recipe (combination of measurement settings) for a particular measurement application and/or stack structure. Presently, setting up a measurement recipe, e.g., for measurement of overlay is automated, but for new applications/processes updating the process can be cumbersome and labor intensive.

A typical recipe optimization flow requires continuous adaptation to stack changes (e.g. in terms of different materials, stack thicknesses, etc.) and different calculation methodologies. Availability of the data required for recipe optimization is limited and therefore qualified/quantified improvements are difficult to implement. Because of this, recipe optimization typically takes a long time and/or requires multiple iterations. Additionally, there is currently only one recipe optimization flow available, for all use-cases. Also, despite tool-to-tool matching specifications, every metrology device behaves slightly differently for each layer. This might result in a sub-optimum recipe for the overall population.

It is therefore proposed to use machine learning (e.g., a neural network) to optimize the measurement recipe in a measurement of a parameter of interest such as overlay. The method may comprise three main phases: a calibration or training phase, a setup phase and a manufacturing phase.

The training phase may use simulated training measurement data on simulated or reference stacks to create a reference measurement set. The reference measurement set may be generic, or specific to a certain use-case (e.g., for a particular structure or device type; by way of a specific example, being specific for 3D-NAND). The simulated measurement data may relate to simulated measurements and simulated responses of simulated stack structures (e.g., based on a general stack database). The measurement set may cover, for example, one or more of:

Target variations (e.g., different overlay values, biases, pitches, target types, CDs, sub-segmentation etc.);

Stack perturbations (e.g., n, k, thickness, side wall angles (SWA) and process asymmetries such as: ΔSWA (differences in SWA of opposing walls of a structure floor tilt, grating imbalance etc.);

Recipe settings (e.g., illumination settings such as wavelength, polarization, bandwidth, illumination aperture, angle of incidence) and/or any other setting/recipe parameters.

These simulations result in overlay qualifiers: e.g., intensities, process asymmetries, stack sensitivity parameters, simulated overlay etc. The training phase then uses a machine learning technique (such as a neural network training technique) to learn the relationship between the simulated input data and simulated output data of the simulations (and any measured data included in the data set) and the corresponding set overlay values. Once trained, the neural network or other trained model can be used to predict optimal measurement settings (e.g., optimal measurement recipe settings). For example, the trained model can learn to predict the expected accuracy and/or sensitivity of an overlay measurement based on a proposed measurement recipe and sparse measurement data.

The model can be additionally trained using some actual measurement data in combination with the simulated measurement data. The difficulty in this approach is the absence of an absolute overlay reference in real measurement data. However, the relationship between unsimulated and measured KPIs can be established by labeling the measurements manually or via another mechanism.

In a setup phase, only a sparse measurement set relating to various illumination conditions is available. The trained model can be applied to this measurement set to determine one or more optimal measurement recipe settings. In an embodiment, the output of such an applied model may be a weighted score of the various options. This provides the option for a user to manually select their own preference based on the weighted score. Both the weighted score and/or the manual selection may take into account other factors and/or preferences such as (for example) metrology effort and/or time (or any other relevant KPI), and/or a preferred balance of measurement accuracy to measurement sensitivity.

In the manufacturing phase high volume manufacturing HVM phase), measurement can be performed using the measurement recipe(s) determined in the setup phase. In addition, an (optional) validation step may be performed to continuously validate/evaluate the efficacy of the measurement recipe(s) being used. In particular such a validation may use the same (or a similarly) trained model to validate and/or classify a measurement by evaluating whether the measurement settings remain optimal (e.g., a binary classification of optimal/non-optimal, or a more complex, score based, validation). It may be that measurement comprising multiple wavelengths/polarization may be required for this manufacturing stage to be properly effective.

The trained model can be dedicated to specific stack-types or even to a particular device. Also, the wavelength selection as described above can be expanded to multi-wavelength-methods.

Current setup is limited by the measurement time. To help accommodate this, the model can (in an embodiment) be separated into a coarse-model and fine-model. This coarse-model and fine-model can then be used to optimize the trade-off between the amount of available data and the quality of estimation.

The measurement reference level (the level of the stack at which overlay is measured) can be determined from simulation. Potentially this level can be linked to a level prediction of the measurements.

Some measurement KPIs cannot be simulated properly and cannot be taken into account in a simulation-based approach. However, a data-driven approach could then be used for such KPIs. Additionally, calibration data and measurement data from previous products/layers can be used to eliminate any tool-to-tool variation which might have an impact on finding the optimum recipe for all metrology devices.

The concepts described herein can be combined. In particular, the neural network for determining the parameter of interest (e.g., overlay) described in the first embodiment may be used as input for and/or form part of the neural network for recipe generation described in this embodiment. As such a combined neural network (or pair of networks), comprising an overlay component for determining overlay and a setting component for optimizing recipe selection, where the latter may be trained in a setting calibration phase, can be used to determine overlay from input images/measurements and also to find an optimal recipe setting for the most accurate overlay measurements from the same (or different) input images/measurements.

Further embodiments are defined in the subsequent numbered clauses:

1. A method of determining a characteristic of interest relating to a structure on a substrate formed by a lithographic process, the method comprising:
    obtaining an input image of the structure; and
    using a trained neural network to determine the characteristic of interest from said input image.

2. A method as defined in clause 1, comprising performing a calibration phase to train the neural network, said calibration phase comprising:
    obtaining first training images of a calibration structure for different values of the characteristic of interest and corresponding known values of the characteristic of interest, said structure and said calibration structure comprising similar structures; and
    using the first training images and corresponding known values of the characteristic of interest to train the neural network to infer values for the characteristic of interest from said first training images.

3. A method as defined in clause 2, wherein said known values for the characteristic of interest are obtained from second training images which are higher quality than said first training images, the second training images being of a corresponding calibration structure as said first training images.

4. A method as defined in clause 3, wherein the second training images comprise computationally enhanced training images.

5. A method as defined in clause 4, wherein the computationally enhanced training images comprise phase retrieved images.

6. A method as defined in clause 4 or 5, wherein said second training images comprise computationally enhanced versions of said first training images.

7. A method as defined in clause 3, wherein a metrology apparatus used to obtain said second training images comprises a sensor having fewer and/or lesser aberrations than a corresponding sensor within a metrology apparatus used to obtain said first training images.

8. A method as defined in any of clauses 3 to 7, wherein said trained neural network comprises an encoder-decoder neural network and said method further comprises outputting an enhanced output image based on said input image.

9. A method as defined in clause 8, wherein said calibration phase comprises using the first training images paired with the corresponding second training images and the known values of the characteristic of interest to train the encoder-decoder neural network.

10. A method as defined in clause 2, wherein said known values are obtained from settings of a lithographic apparatus used to form said calibration structure.

11. A method as defined in any of clauses 2 to 10, wherein:
the neural network comprises an expanded neural network trained to handle a vector of multiple images corresponding to measurement of said calibration structure for different illumination characteristics of measurement illumination, and
said input image has been obtained using a plurality of illumination characteristics.

12. A method as defined in any of clauses 2 to 10 wherein the method further comprises:
training an expanded neural network to handle a vector of multiple images corresponding to measurement of said calibration structure for different illumination characteristics of measurement illumination; and
using the expanded neural network as a reference to select a preferred profile for the characteristic of interest from said input image having been obtained using a plurality of illumination characteristics, wherein each profile relates to an illumination characteristic.

13. A method as defined in any of clauses 2 to 12, wherein the trained neural network relates to a class of sensors used for obtaining said first training images and the calibration phase is performed for the class of sensors.

14. A method as defined in any of clauses 2 to 12, wherein the trained neural network relates to an individual sensor used for obtaining said first training images and the calibration phase is performed for the individual sensor.

15. A method as defined in any preceding clause, comprising performing a transfer learning step comprising training one or more of the final layer(s) of the neural network for one or more specific lithographic steps relevant to a particular process which is to be monitored.

16. A method as defined in any preceding clause, wherein an output layer of said neural network comprises a regression layer.

17. A method as defined in any preceding clause, wherein said trained neural network comprises a trained residual neural network.

18. A method as defined in any preceding clause, further comprising:
using the trained neural network to determine one or more optimal measurement settings from said input image.

19. A method as defined in clause 18, comprising performing a setting calibration phase to train the neural network, said setting calibration phase comprising:
obtaining training measurement data of a calibration structure for different values of the characteristic of interest, for different measurement settings and for other structure and/or stack parameter variations, and further obtaining corresponding known values of the characteristic of interest, and
using the training measurement data and corresponding known values of the characteristic of interest to train the neural network, or a setting component thereof, to infer the efficacy of a measurement of the characteristic of interest based on the measurement settings.

20. A method as defined in clause 19, wherein said training measurement data comprises simulated measurement data on simulated structures to obtain simulated measurement responses.

21. A method as defined in any of clauses 18 to 20, wherein said using a trained neural network to determine one or more optimal measurement settings comprises determining one or more measurement recipe settings, a measurement recipe setting describing a combination of measurement settings.

22. A method as defined in clause 21, wherein said using a trained neural network to determine one or more optimal measurement settings comprises using a trained neural network to determine a scoring for each of a plurality of candidate measurement recipe settings, each candidate measurement recipe setting describing a candidate combination of measurement settings.

23. A method as defined in clause 21 or 22 further comprising using the trained neural network or a similar trained neural network to validate a selected measurement recipe setting during a manufacturing process which is monitored using measurements performed using the selected measurement recipe setting.

24. A method as defined in clause 23, wherein the validation step comprises classifying whether, for a measurement, the optimal measurement setting recipe was used.

25. A method as defined in any of any preceding clause, wherein the neural network, or the setting component, is separated into a coarse-neural network and a fine-neural network, to optimize a trade-off between the amount of available data and the quality of estimation.

26. A method as defined in clause 1, comprising performing a calibration phase to train the neural network, said calibration phase comprising:
obtaining reference data and associated reference values for the characteristic of interest, said reference data relating to a scattering response of measurement illumination to different reference structure geometries; and
using reference data and associated reference values to train the neural network to infer values for the characteristic of interest from said reference data.

27. A method as defined in clause 26, wherein the reference data further relates to measurement illumination having various illumination characteristics.

28. A method as defined in clause 26 or 27, wherein the reference data further relates to different stack structures and/or reference structures in different layers.

29. A method as defined in clause 26, 27 or 28, wherein the stack structure of said structure is different to any of the stack structures comprised within the reference data.

30. A method as defined in any of clauses 26 to 29, wherein the structure and the reference structure geometries describe a single grating target per measurement direction formed in two layers, for measuring overlay.

31. A method as defined in any of clauses 26 to 30, wherein the reference data comprises simulated data.

32. A method as defined in any preceding clause, wherein the characteristic of interest is one or more of: overlay, critical dimension, any other reconstruction parameter, focus, dose, line edge roughness, line width roughness, any 2D contour parameter, and an illumination characteristic or aberration of the lithographic apparatus used in said lithographic process.

33. A method as defined in any preceding clause, wherein said structure comprises a multi-sensitivity target having more than two features with different sensitivities to the characteristic of interest.

34. A method as defined in clause 33, wherein said multi-sensitivity target comprises more than five features with different sensitivities to the characteristic of interest.

35. A method as defined in clause 33, wherein said multi-sensitivity target comprises more than ten features with different sensitivities to the characteristic of interest.

36. A method as defined in any of clauses 33 to 35, wherein said features with different sensitivities are included in two orthogonal orientations.

37. A method as defined in any of clauses 33 to 36, wherein said features with different sensitivities each comprise a periodic feature with variation in pitch and/or critical dimension.

38. A method as defined in clause 37, wherein each periodic feature comprises first and second pitches, the second pitch being twice the first pitch.

39. A method as defined in clause 37 or 38, wherein said periodic features are formed by corresponding reticle features on a reticle, said reticle features comprising sub-resolution features which result in a measurable feature variation on the substrate that is dependent on focus and/or dose during formation of said structure.

40. A method as defined in clause 39, wherein the feature variation comprises a variation in a 2D contour of the periodic features.

41. A method as defined in clause 39 or 40, wherein said reticle features comprise sub-features, and pairs of said sub-features comprise oppositely oriented sub-resolution features.

42. A method as defined in clause 41, wherein said pairs of said sub-features comprising oppositely oriented sub-resolution features are arranged in combination with line features having no sub-resolution features.

43. A reticle comprising a target forming feature comprising more than two sub-features each having different sensitivities to a characteristic of interest when imaged onto a substrate to form a corresponding target structure on said substrate.

44. A reticle as defined in clause 43, comprising more than five sub-features each having different sensitivities to a characteristic of interest when imaged onto a substrate to form a corresponding target structure on said substrate.

45. A reticle as defined in clause 43, comprising more than ten sub-features each having different sensitivities to a characteristic of interest when imaged onto a substrate to form a corresponding target structure on said substrate 46. A reticle as defined in any of clauses 43 to 45, wherein said sub-features with different sensitivities are included in two orthogonal orientations.

47. A reticle as defined in any of clauses 43 to 46, wherein said sub-features with different sensitivities each comprise a periodic feature with variation in pitch and/or critical dimension.

48. A reticle as defined in clause 47, wherein each periodic feature comprises first and second pitches, the second pitch being twice the first pitch.

49. A reticle as defined in clause 47 or 48, wherein said periodic features are formed by corresponding reticle features on a reticle, said reticle features comprising sub-resolution features which result in a feature shift on the substrate, the magnitude of which is dependent on focus and/or dose during formation of said target structure.

50. A reticle as defined in clause 49, wherein said periodic features comprise pairs of line features comprising oppositely oriented sub-resolution features.

51. A reticle as defined in clause 50, wherein said periodic features comprise line features having no sub-resolution features alternating with said pairs of line features comprising oppositely oriented sub-resolution features.

52. A substrate comprising a target structure formed from said target forming feature as defined in any of clauses 43 to 51.

53. A method for determining a characteristic of interest relating to a structure on a substrate formed by a lithographic process, the method comprising:
   obtaining an image of the target structure of clause 52; and
   determining the characteristic of interest from said image of the target structure.

54. A method as defined in clause 53, comprising measuring a metric across the image of the target structure, and determining the characteristic of interest from said metric.

55. A method as defined in clause 54, wherein the metric is one or more of: critical dimension, feature variation, any other reconstruction parameter, line edge roughness, line width roughness, and any 2D contour parameter.

56. A method as defined in clause 54 or 55, wherein determining the characteristic of interest from said metric comprises inputting the metric into a trained neural network or an inference model and noting the output.

57. A method as defined in clause 56, comprising performing a calibration phase to train the neural network, said calibration phase comprising:
   obtaining calibration images of a calibration structure for different values of the characteristic of interest and corresponding known values of the characteristic of interest, said target structure and said calibration structure comprising similar structures; and
   using metric values obtained from the calibration images and corresponding known values of the characteristic of interest to train the neural network or inference model to infer values for the characteristic of interest from said calibration images.

58. A method as defined in clause 54 or 55, wherein determining the characteristic of interest from the determined metric comprises using an n-dimensional calibration curve.

59. A method as defined in clause 58, comprising performing a calibration phase to determine said n-dimensional calibration curve, said calibration phase comprising:
   obtaining calibration images of a calibration structure for different values of the characteristic of interest and corresponding known values of the characteristic of interest, said target structure and said calibration structure comprising similar structures;
performing a dimensionality reduction on the metric values obtained from the calibration images determine said n-dimensional calibration curve to correlate differences in the metric values to differences in the characteristic of interest.

60. A method as defined in clause 59, wherein the dimensionality reduction comprises a principal or other component analysis or a linear discriminant analysis.

61. A metrology system for determining a characteristic of interest relating to at least one structure on a substrate formed by a lithographic process, the metrology apparatus comprising:
a trained neural network; and
a processor being configured to:
obtain an input image of the structure; and
use the trained neural network to determine the characteristic of interest from said input image.

62. A method for training a neural network, comprising:
obtaining first training images of a calibration structure for different values of a characteristic of interest and corresponding known values of the characteristic of interest; and
using the first training images and corresponding known values of the characteristic of interest to train the neural network to infer values for the characteristic of interest from said first training images.

63. A method as defined in clause 62, wherein said known values for the characteristic of interest are obtained from second training images which are higher quality than said first training images, the second training images being of a corresponding calibration structure as said first training images.

64. A method of optimizing measurement settings for measuring a characteristic of interest relating to a structure on a substrate formed by a lithographic process, the method comprising:
obtaining measurement data relating to measurement of the structure; and
using a trained model to determine one or more optimal measurement settings from said measurement data.

65. A method as defined in clause 64, comprising performing a calibration phase to train the model, said calibration phase comprising:
obtaining training measurement data of a calibration structure for different values of the characteristic of interest, for different measurement settings and for other structure and/or stack parameter variations, and further obtaining corresponding known values of the characteristic of interest, and
using the training measurement data and corresponding known values of the characteristic of interest to train the neural network to infer the efficacy of a measurement of the characteristic of interest based on the measurement settings.

66. A method as defined in clause 65, wherein said training measurement data comprises simulated measurement data on simulated structures to obtain simulated measurement responses.

67. A method as defined in any of clauses 64 to 66, wherein said using a trained model to determine one or more optimal measurement settings comprises determining one or more measurement recipe settings, a measurement recipe setting describing a combination of measurement settings.

68. A method as defined in clause 67, wherein said using a trained model to determine one or more optimal measurement settings comprises using a trained model to determine a scoring for each of a plurality of candidate measurement recipe settings, each candidate measurement recipe setting describing a candidate combination of measurement settings.

69. A method as defined in clause 67 or 68, further comprising using the trained model or a similar trained model to validate a selected measurement recipe setting during a manufacturing process which is monitored using measurements performed using the selected measurement recipe setting.

70. A method as defined in clause 69, wherein the validation step comprises classifying whether, for a measurement, the optimal measurement setting recipe was used.

71. A method for calibrating a model comprising:
obtaining training measurement data of a calibration structure for different values of a characteristic of interest, for different measurement settings and for other structure and/or stack parameter variations, and further obtaining corresponding known values of the characteristic of interest, and
using the training measurement data and corresponding known values of the characteristic of interest to train the neural network to infer the efficacy of a measurement of the characteristic of interest based on the measurement settings.

72. A method as defined in clause 71, wherein said training measurement data comprises simulated measurement data on simulated structures to obtain simulated measurement responses.

73. A method as defined in any of clauses 64 to 72, wherein said trained model comprises a trained neural network.

74. A method as defined in any of clauses 64 to 73, wherein the model is separated into a coarse-model and a fine-model, to optimize a trade-off between the amount of available data and the quality of estimation.

75. A method as defined in any of clauses 62 to 74, wherein the characteristic of interest is overlay or focus.

76. A non-transitory computer program product comprising machine-readable instructions for causing a processor to cause performance of the method of any of clauses 1 to 42, 53 to 60 and 62 to 75.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). It is also to be noted that the term metrology apparatus or metrology system encompasses or may be substituted with the term inspection apparatus or inspection system. A metrology or inspection apparatus as disclosed herein may be used to detect defects on or within a substrate and/or defects of structures on a substrate. In such an embodiment, a characteristic of the structure on the substrate may relate to defects in the structure, the absence of a specific part of the structure, or the presence of an unwanted structure on the substrate, for example.

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. With respect to the multi-sensitivity target embodiment, the different product features may comprise many regions with varying sensitivities (varying pitch etc.). Further, pitch p of the metrology targets is close to the resolution limit of the optical system of the scatterometer, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:
obtaining a low-quality input image of a metrology target formed on a substrate by a lithographic process, wherein the metrology target comprises at least one feature corresponding to a characteristic of interest, and wherein the metrology target comprises at least two sub-targets having periodic patterns arranged orthogonal to each other;
performing a calibration phase to train a neural network, the calibration phase comprising:
obtaining first low-quality training images of a calibration metrology target formed on a calibration substrate by a calibration lithographic process having different values of the characteristic of interest and corresponding known values of the characteristic of interest, the metrology target and the calibration metrology target comprising similar structures; and
using the first low-quality training images and corresponding known values of the characteristic of interest to train the neural network to infer values of the characteristic of interest from the first low-quality training images,
wherein the corresponding known values of the characteristic of interest are obtained from second high-quality training images which are a higher quality than the first low-quality training images, the second high-quality training images being of a corresponding calibration metrology target as the first low-quality training images;
using the trained neural network to determine the characteristic of interest relating to the metrology target based on the low-quality input image; and
using the trained neural network to determine one or more optimal measurement recipes, wherein each measurement recipe comprises a combination of measurement settings,
wherein the characteristic of interest comprises overlay, focus, an energetic illumination characteristic, a geometric non-telecentricity illumination characteristic, dose, or an aberration, and
wherein training of the neural network is limited to the metrology target.

2. The method of claim 1, further comprising using a metrology apparatus to obtain the second high-quality training images through using a sensor having fewer and/or lesser aberrations than a corresponding sensor within a metrology apparatus used to obtain the first low-quality training images.

3. The method of claim 1, further comprising:
outputting an enhanced output image based on the low-quality input image;
wherein the trained neural network comprises an encoder-decoder neural network.

4. The method of claim 1, wherein:
the neural network comprises an expanded neural network trained to handle a vector of multiple images corresponding to measurement of the calibration metrology target for different illumination characteristics of measurement illumination, and
the low-quality input image has been obtained using a plurality of illumination characteristics.

5. The method of claim 1, further comprising performing transfer learning comprising training one or more of final layer(s) of the neural network for one or more specific lithographic steps relevant to a particular process which is to be monitored.

6. The method of claim 1, wherein the characteristic of interest comprises two or more of: overlay, critical dimension, any other reconstruction parameter, focus, dose, line edge roughness, line width roughness, any 2D contour parameter, an illumination characteristic, or an aberration of a lithographic apparatus used in the lithographic process.

7. The method of claim 1, wherein:
the metrology target comprises a multi-sensitivity metrology target; and
the multi-sensitivity metrology target comprises at least five different features with corresponding different sensitivities to the characteristic of interest.

8. The method of claim 7, wherein the at least five different features with corresponding different sensitivities each comprise a periodic feature with variation in pitch and critical dimension.

9. A metrology system for determining a characteristic of interest relating to at least one multi-sensitivity metrology target on a substrate formed by a lithographic process, wherein the multi-sensitivity metrology target comprises at least two sub-targets having periodic patterns arranged orthogonal to each other and having different sensitivities to the characteristic of interest, the metrology apparatus comprising:
a trained neural network; and
a processor being configured to:
obtain a low-quality input image of the multi-sensitivity metrology target, wherein the multi-sensitivity metrology target comprises at least five different features with corresponding different sensitivities to the characteristic of interest; and use the trained neural network to determine the characteristic of interest relating to the multi-sensitivity metrology target from the low-quality input image, wherein the characteristic of interest comprises overlay, focus, an energetic illumination characteristic, a geometric non-telecentricity illumination characteristic, dose, or an aberration, wherein the trained neural network is trained based at least in part on low-quality training images of a calibration multi-sensitivity metrology target formed on a calibration substrate by a calibration lithographic process, the multi-sensitivity metrology target and the calibration multi-sensitivity metrology target comprising similar structures, and wherein training of the trained neural network is limited to the multi-sensitivity metrology target.

10. A non-transitory computer readable storage medium having computer readable code thereon, the non-transitory computer readable medium including instructions configured to cause a computer system to perform operations comprising:

obtaining a low-quality input image of a metrology target formed on a substrate by a lithographic process, wherein the metrology target comprises at least one feature corresponding to a characteristic of interest, and wherein the metrology target comprises at least two sub-targets having periodic patterns arranged orthogonal to each other;

performing a calibration phase to train a neural network, the calibration phase comprising:

obtaining first low-quality training images of a calibration metrology target formed on a calibration substrate by a calibration lithographic process having different values of the characteristic of interest and corresponding known values of the characteristic of interest, the metrology target and the calibration metrology target comprising similar structures; and using the first low-quality training images and corresponding known values of the characteristic of interest to train the neural network to infer values of the characteristic of interest from the first low-quality training images, wherein the corresponding known values of the characteristic of interest are obtained from second high-quality training images which are a higher quality than the first low-quality training images, the second high-quality training images being of a corresponding calibration metrology target as the first low-quality training images;

using the trained neural network to determine the characteristic of interest relating to the metrology target based on the low-quality input image; and using the trained neural network to determine one or more optimal measurement recipes, wherein each measurement recipe comprises a combination of measurement settings, wherein the characteristic of interest comprises overlay, focus, an energetic illumination characteristic, a geometric non-telecentricity illumination characteristic, dose, or an aberration, and wherein training of the neural network is limited to the metrology target.

11. The method of claim 1, wherein the characteristic of interest is overlay.

12. The method of claim 1, wherein the characteristic of interest is an aberration.

13. The method of claim 6, wherein the characteristic of interest comprises focus and dose.

14. The method of claim 1, wherein the trained neural network is not based on inversion or inverted features.

15. The method of claim 1, wherein the calibration phase is performed for an individual sensor or a class of sensors having high aberrations.

16. The method of claim 1, wherein the low-quality input image is obtained by a sensor comprising low-quality optics having high aberrations.

17. The method of claim 1, further comprising using the trained neural network to determine an accuracy of a measurement of the characteristic of interest based on the one or more optimal measurement recipes.

18. The method of claim 1, further comprising using the trained neural network to determine a scoring for each of a plurality of candidate measurement recipes.

19. The method of claim 1, wherein the trained neural network is separated into a coarse trained neural network and a fine trained neural network.

* * * * *

UNITED STATES PATENT AND TRADEMARK OFFICE
CERTIFICATE OF CORRECTION

| | |
|---|---|
| PATENT NO. | : 12,112,260 B2 |
| APPLICATION NO. | : 16/424811 |
| DATED | : October 8, 2024 |
| INVENTOR(S) | : Tripodi et al. |

It is certified that error appears in the above-identified patent and that said Letters Patent is hereby corrected as shown below:

In the Specification

In Column 1, Line 38, delete "K1" and replace with --$k_1$--;

In Column 1, Line 42, delete "K1" and replace with --$k_1$--;

In Column 1, Line 43, delete "K1" and replace with --$k_1$--.

In Column 6, Line 8, delete "LC" and replace with --LC,--.

In Column 9, Line 46, delete "skilled," and replace with --skilled--.

In Column 15, Line 22, delete "overlay" and replace with --(e.g., overlay--;

In Column 15, Line 45, delete "Bossung," and replace with --Bossung--.

In Column 22, Line 25, delete "μm2." and replace with --$\mu m^2$.--.

In Column 25, Line 24, delete "structure" and replace with --structure),--;

In Column 25, Line 64, delete "high" and replace with --(e.g., high--.

In Column 26, Line 16, delete "tine-model." and replace with --fine-model.--.

Signed and Sealed this
Twelfth Day of November, 2024

Katherine Kelly Vidal
*Director of the United States Patent and Trademark Office*